United States Patent [19]

Kosonocky et al.

[11] Patent Number: 5,355,165
[45] Date of Patent: Oct. 11, 1994

[54] VERY HIGH FRAME RATE CCD IMAGER

[75] Inventors: Walter F. Kosonocky, Skillman; John L. Lowrance, Princeton, both of N.J.

[73] Assignees: Princeton Scientific Instruments, Inc., Monmouth Junction; New Jersey Institute of Technology, Newark, both of N.J.

[21] Appl. No.: 925,219

[22] Filed: Aug. 6, 1992

[51] Int. Cl.$^5$ ............................................. H04N 3/14
[52] U.S. Cl. ................................. 348/311; 348/315
[58] Field of Search ................... 358/213.23, 213.26, 358/213.29, 213.11; 257/215, 232; H04N 3/14, 3/15

[56] References Cited

U.S. PATENT DOCUMENTS

| | | | |
|---|---|---|---|
| 4,833,539 | 5/1989 | Berger | 358/213.29 |
| 5,148,013 | 9/1992 | Yamada | 358/213.23 |
| 5,210,613 | 5/1993 | Lee | 358/213.26 |

Primary Examiner—Joseph Mancuso
Assistant Examiner—Wendy R. Greening
Attorney, Agent, or Firm—Henry I. Schanzer

[57] ABSTRACT

Circuits and systems embodying the invention include an image sensor comprising an array of "M" photo sensing elements arranged in "R" rows and "C" columns, where R and C are integers greater than one and R times C is equal to M. Coupled to each one of the photo sensing elements is a storage register functioning as a local memory, with each storage register comprising N storage elements, where N may range from a few to several hundred (or even several thousand) storage elements. Each photo sensing element is coupled to its associated N storage elements for selectively enabling the high speed transfer of photo information from each photo sensing element to its associated N storage elements during a photo data acquisition phase. The N storage elements associated with each photosensing element function as a local memory enabling up to "N" frames of information to be captured and transferred at a high frame rate from the photosensing element to the storage elements during image (photo) sensing and the storage of the "N" frames of information until the subsequent read-out of the stored information. The registers are preferably formed using charge coupled devices (CCD's). The N storage elements of each register may be arranged in a purely serial format or in a serial-parallel format or arranged like an X-Y memory array.

32 Claims, 22 Drawing Sheets

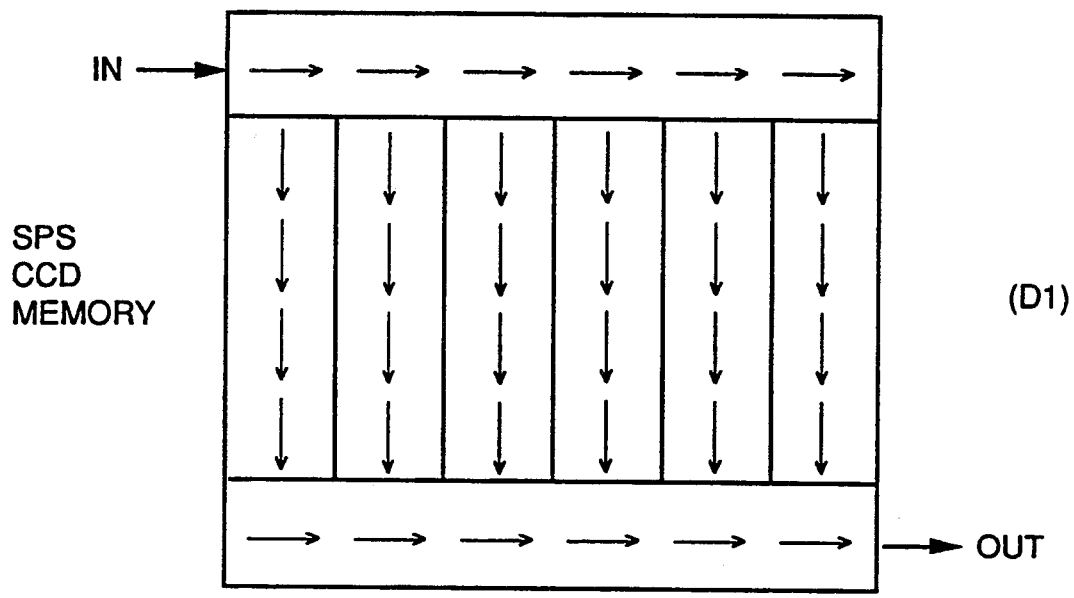
Fig. 5D1
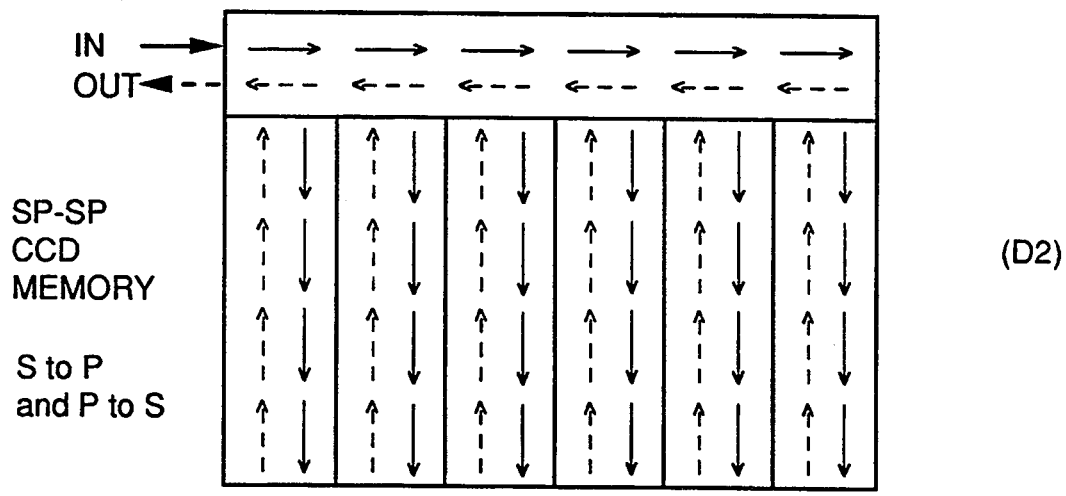
Fig. 5D2

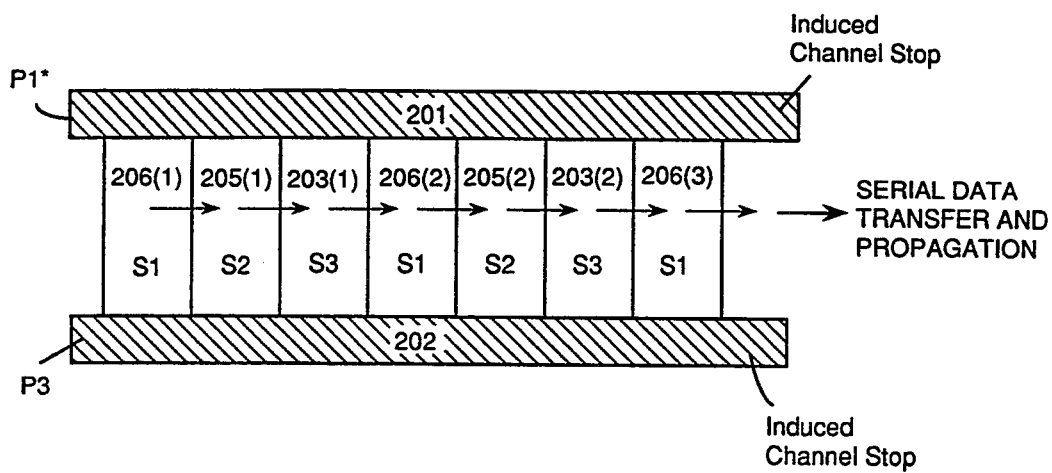
Fig. 10C1
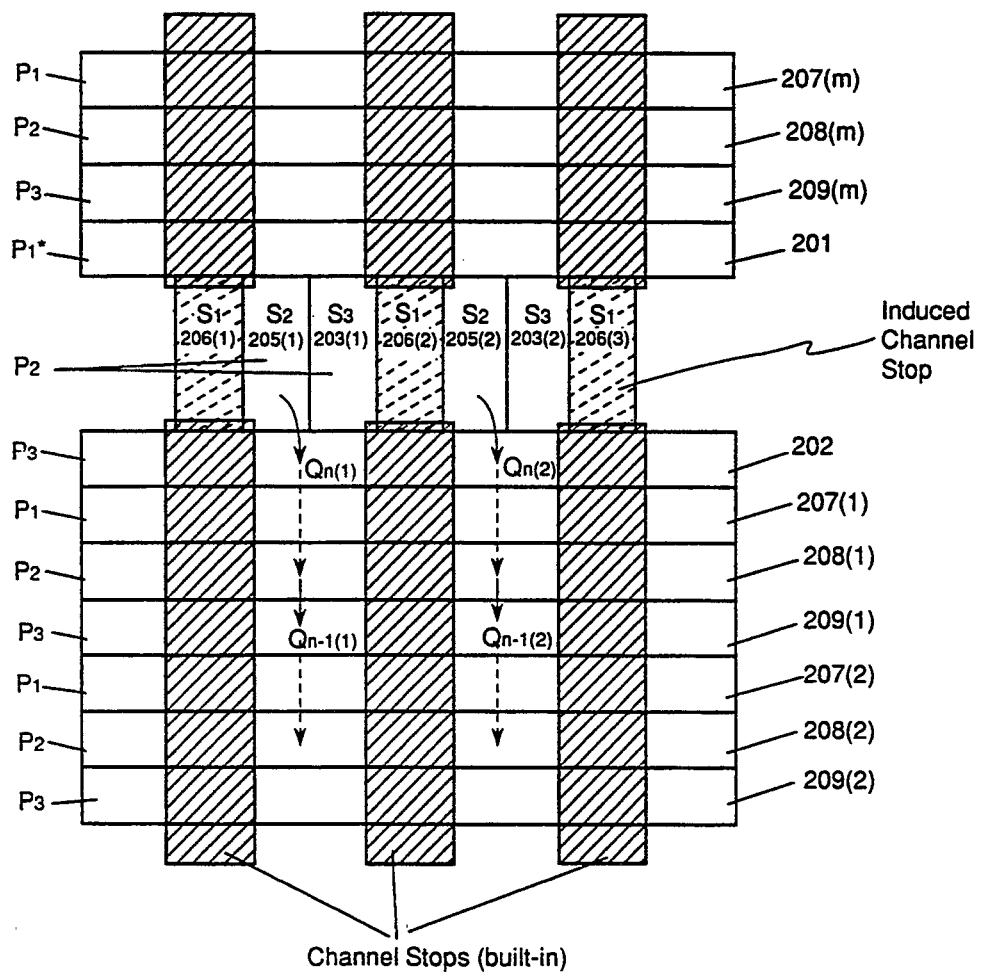
Fig. 10C2

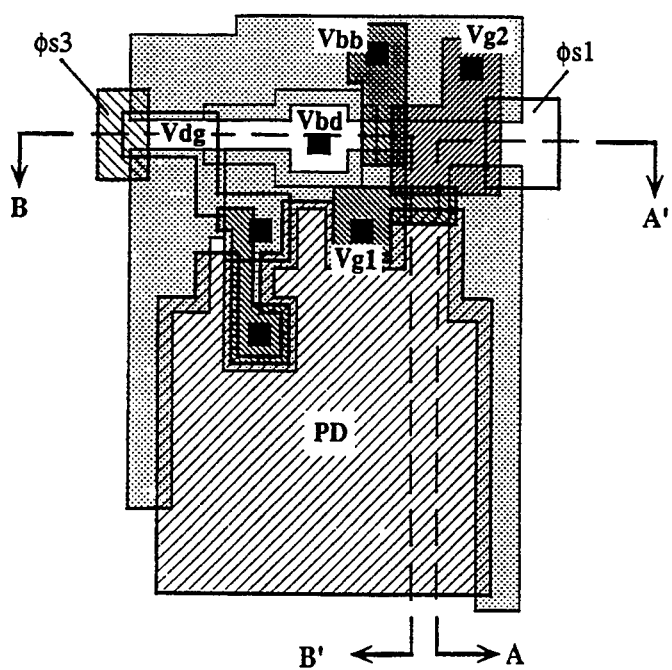
Fig. 14A
- Poly 1
- Poly 2
- Poly 3
- Poly 4
- Photodiode
- Channel Stop
- N+ Implant
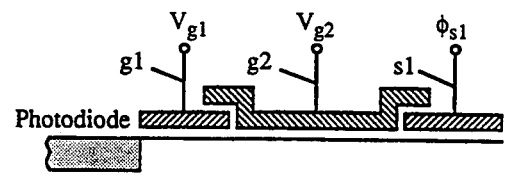
Fig. 14B1
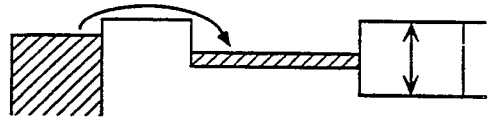
Fig. 14B2
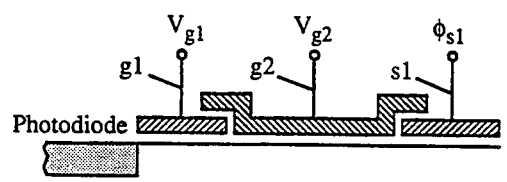
Fig. 14C1
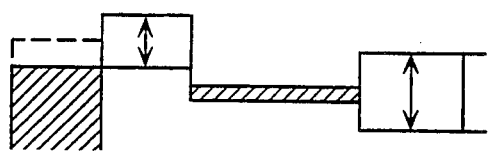
Fig. 14C2
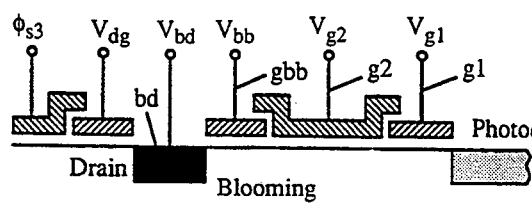
Fig. 14D1
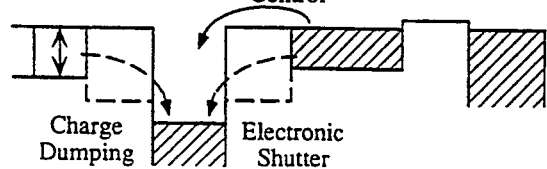
Fig. 14D2

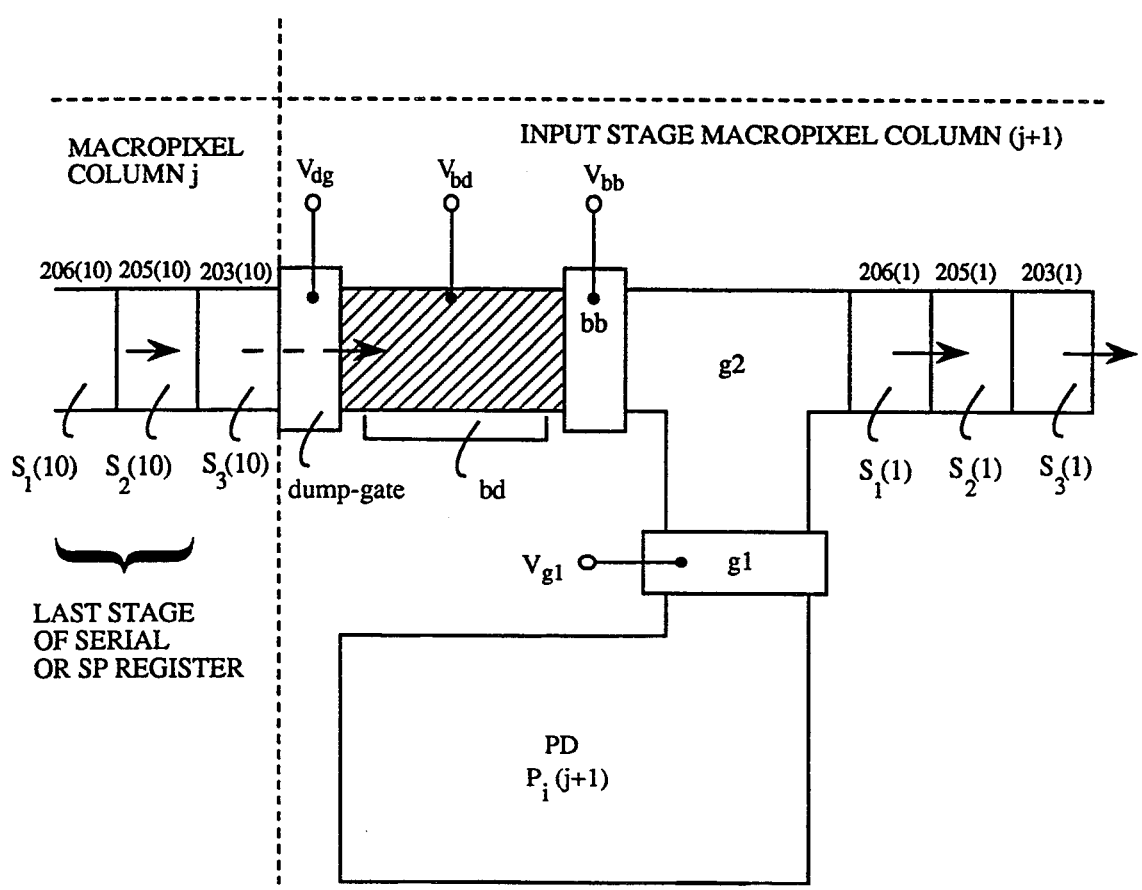
Fig. 14E1

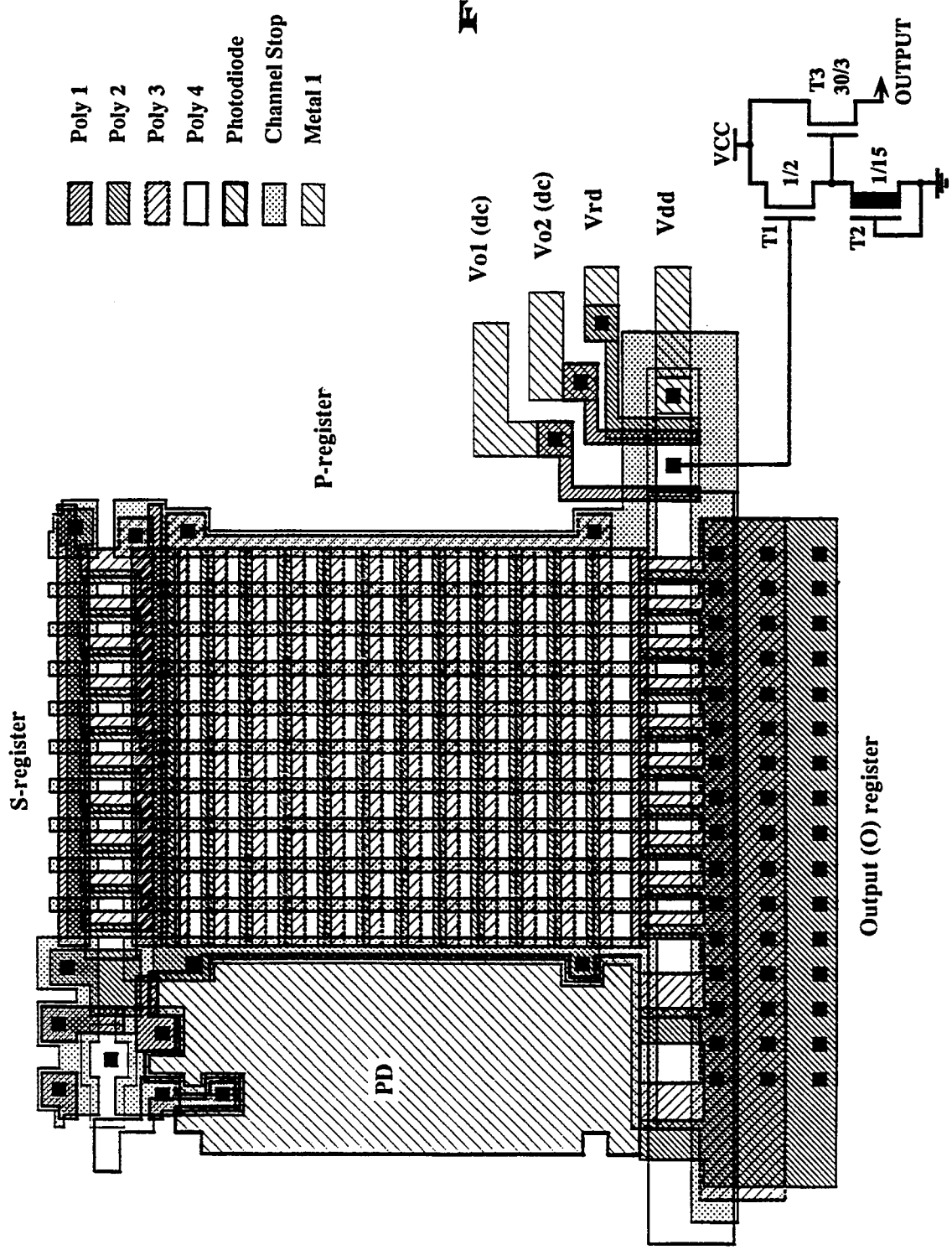

VERY HIGH FRAME RATE CCD IMAGER

This invention was made with government support under Contract N00014-91-C-0078 awarded by the Department of the Navy. The government has certain rights in the invention.

BACKGROUND OF THE INVENTION

This invention relates to image sensors, also referred to herein either as photo imagers, photo sensors or simply as "imagers". In particular, this invention relates to an imager capable of capturing a predetermined number of frames at a very high frame rate. A "frame" of information as used herein refers to the image sensed by a photosensor array during one sampling interval. That is, a "frame" includes all the information sensed by, and read out from, all the photo sensing elements of a photosensor array during one sampling interval. Thus, a frame corresponds, in essence, to a "snapshot".

There is a need for image sensors capable of, for example, capturing images of rapid motion and transient photometric phenomena. In general, there is a need for photo imagers capable of sensing and capturing photo signals changing at a very high rate and for storing the information captured such that it can be subsequently read out at a different (e.g., slower) rate. More specifically, there is a need for a photo imager capable of sensing and storing a high number of frames while operating at a very high frame rate during a data (e.g. image) acquisition phase. For example, such an image sensor system should be capable of capturing several hundred, or more, frames at a frame rate of a million (or more) frames per second.

Circuits and systems embodying the invention enable the construction of an image sensor system capable of capturing a high number of frames at a very high frame rate.

SUMMARY OF THE INVENTION

Circuits and systems embodying the invention include an image sensor comprising an array of M photo sensing elements arranged in "R" rows and "C" columns; where M is equal to R times C, and R and C are integers greater than one. Coupled to each one of the photo sensing elements is a storage register functioning as a local memory, with each storage register comprising N storage elements, where N may range from a few to several hundred (or even several thousand) storage elements. Each photo sensing element is coupled to its associated N storage elements for selectively enabling the high speed transfer of photo information from each photo sensing element to its associated N storage elements during a photo data acquisition phase. The N storage elements associated with each photosensing element function as a local memory enabling up to "N" frames of information to be captured and transferred at a high frame rate from the photosensing element to the storage elements during image (photo) sensing and the storage of the "N" frames of information until the subsequent read-out of the stored information.

In some embodiments, the M storage registers (one storage register per photo sensing element) are arranged in "R" rows and of "C" columns with the "R" storage registers of all the rows, along a column, being interconnected to each other for selectively enabling the transfer of information, in parallel, from the storage registers of one row to the storage registers of a succeeding row, along the column, during the read out of the photo data from the storage elements.

In one embodiment of the invention, the N storage elements associated with each photosensing element are organized into "X" subrows with N/X storage elements per subrow defining N/X subcolumns. During a data acquisition phase, information is serially transferred from each photo sensitive element to the first subrow. When the first subrow is filled the information in the first subrow is transferred, in parallel, to the next subrow. The process is repeated until the "X" subrows are filled with photo information.

Then, during a subsequent photo data read-out phase, the contents of all the subrows are read out, in parallel, from subrow to subrow, in an ordered manner, with the N/X storage elements of a subrow within a column being transferred, in parallel, to the N/X storage elements of a succeeding row in the same column. The last subrow of the array is coupled to a serial output register for the transfer of the photo information via amplifying means to processing and decoding circuitry.

In still another embodiment of the invention, the M (i.e. R×C) photo sensing elements and their M (i.e. R×C) associated storage registers are arranged in an array. During an image acquisition phase, photo information is serially propagated from each photo sensing element into, and along, its associated storage register. Where each storage register comprises N storage elements, N photo samples can be stored in each storage register which amounts to the storing of N frames of photo information in one image sensor. During a subsequent read-out phase, the information contained in the storage registers is selectively read out by enabling selected row (Xi) and column (Yj) conductors. This type of structure is very flexible in that it enables the information to be read out either frame-by-frame, in the same order it was sensed, or in any one of numerous other ways.

In the discussion of the invention, each photo sensing element and its associated storage register of N storage elements is also sometimes referred as a "macropixel". The macropixels of an array are shown arranged in R rows and C columns but different lay outs of the macropixels are within the contemplation of the invention.

In circuits embodying the invention, the storage registers and their N storage elements are preferably charge coupled devices (CCDs) which function as analog storage elements. Thus, storage registers employing CCD devices function as analog registers and may be configured to form an analog memory.

BRIEF DESCRIPTION OF THE DRAWINGS

In the accompanying drawings, like reference characters denote like components.

FIG. 5D1 is a block diagram of serial-to-parallel-to-serial connected registers;

FIG. 5D2 is a block diagram of serial-to-parallel and parallel-to-serial registers;

FIGS. 10A1 and 10A2 are cross sections taken along lines A–A' of FIG. 9 showing two different types of channel stops in the parallel register;

FIGS. 10C1 and 10C2 are conceptual representations of the charge transfer gating arrangements in FIGS. 9, 10A and 10B;

FIG. 14A is a top view of an input structure of the type used in FIG. 11 associated with a photo diode useful in circuits embodying the invention;

FIG. 14B1 and 14C1 shows a cross section of a portion of FIG. 14A;

FIG. 14B2 is a potential diagram illustrating operation of the charge input stage of FIGS. 14A and 14B1 in a continuous charge skimming mode;

FIG. 14C2 is a potential diagram illustrating the voltage reset mode of charge read-out from the photodiode of FIGS. 14A and 14C1;

FIG. 14D1 is a cross section along B–B' of a portion of FIG. 14A detailing the blooming control;

FIG. 14D2 is a potential diagram illustrating blooming control and electronic exposure control;

FIG. 14E1 is a conceptual representation of a charge transfer gating arrangement between adjacent macropixels; and FIG. 15 is a top view of the macropixel of FIG. 11 coupled to a serial output register.

DETAILED DESCRIPTION OF THE INVENTION

Figure 1:
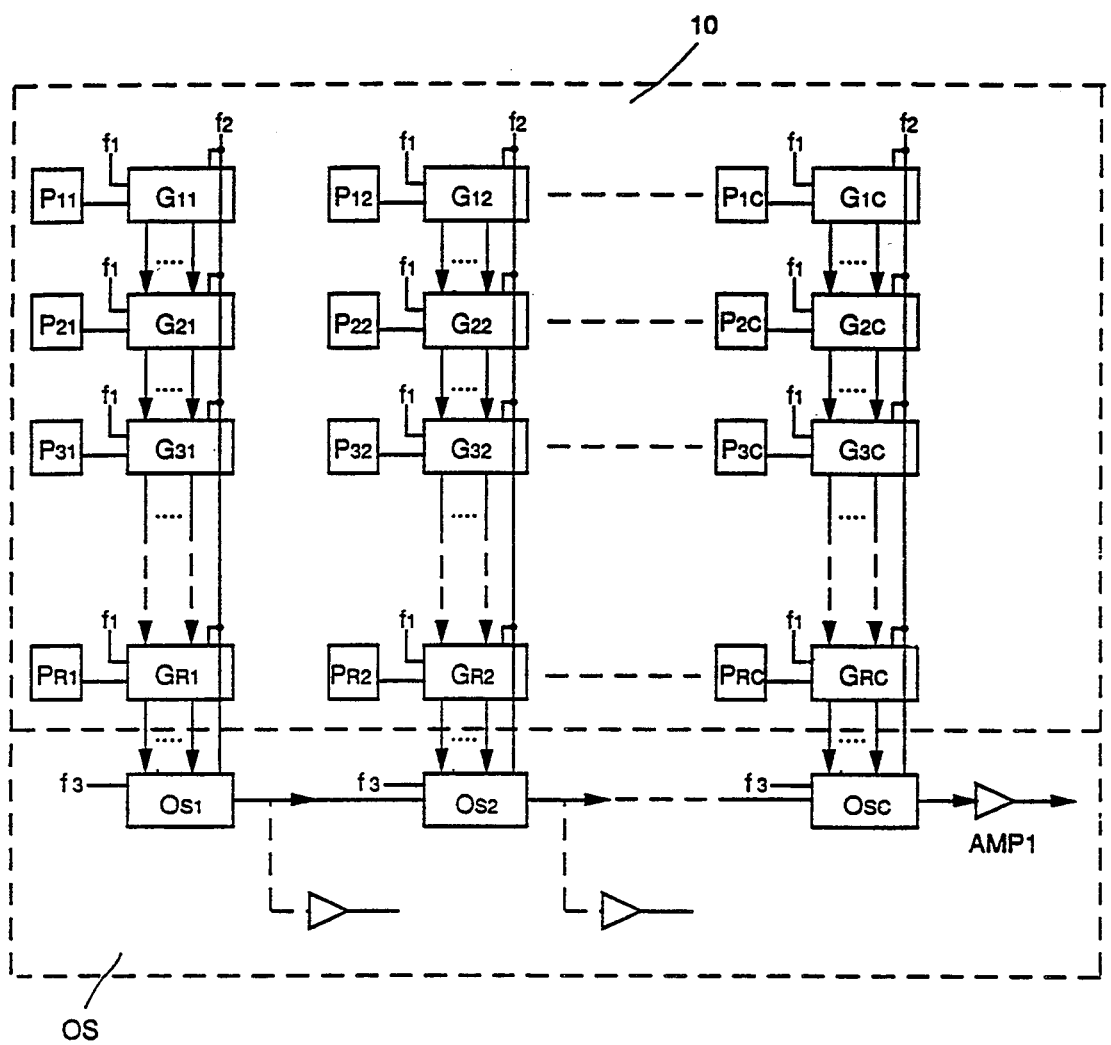
FIG. 1 is a block diagram outlining the architecture of an image sensor embodying the invention.

FIG. 1 is a simplified block diagram representation of an image sensor ("imager") 10 embodying the invention. The imager 10 includes an array of photosensitive elements Pij and an array of storage registers Gij arranged in "R" rows and "C" columns. The photosensitive elements Pij may be photodiodes or any other suitable photoresponsive elements such as photoconductors or photogates (e.g. a photosensitive CCD element). The signal output of each photosensitive element Pij is coupled to the input of an associated storage register Gij. Each storage register Gij includes N analog storage stages; where N may range from a few stages to several thousand stages, and where each stage is designed to store the picture information (pixel) sensed during one sampling interval. During a photo acquisition phase, each storage register Gij associated with a photosensor Pij functions essentially as a serial register with information being transferred during each sampling interval from each photosensor Pij to the input of its corresponding storage register Gij and, concurrently, information is transferred serially from stage to stage along each register.

During an image (or signal) acquisition phase, photo information is transferred from each photosensor Pij to its corresponding register Gij by means of a clock signal f1 which also controls the rate at which the photo signals are propagated serially along each register. [Clock f1 may include several phases (not shown) depending on the type of register structure.] Typically each one of the M (where M=R×C) photosensors, Pij, is sampled at the same time and the signal sampled from each photo sensor Pij is transferred from the photosensor to the first (input) storage stage of the corresponding Gij storage register. Concurrently, the photo information contained within storage register Gij is advanced by one stage.

When the N storage stages of each Gij register are filled or loaded with photo information, the storage registers Gij, in each column, are read out in parallel with the information stored in register (Gij) of row i and column j being transferred to register [G(i+1)j] of row (i+1) in column j. The information is clocked from row to row via a clocking signal f2. The clocking signal f2 may include several phases (not shown) depending on the particular structure. The information in the Rth row of the storage registers is transferred, in parallel, to an output serial shift register (OS) with each columnar section of the output register (OSj) having at least the same number of columns as the Gij registers. The information transferred to the output serial register (OS) is transferred serially from stage to stage under the control of a clocking signal f3 to an output amplifier, AMP1. It should be appreciated that to increase the speed of operation and to reduce the number of transfers, more than one output amplifier could be used. That is, there could be an output amplifier per column, as shown in dashed lines, or an output amplifier per group of columns.

For example, assuming each Gij register to have 300 stages, the image sensor 10 could be used to capture and store 300 frames of information at a rate determined primarily by the f1 clock. This enables the high speed capture of a transient phenomena. Once the three hundred frames are captured, the information in the Gij registers can be moved down, in parallel, row by row, at a rate determined by the f2 clock. The f2 clock may have a wide range of values and may be made much slower than the f1 clock if the system requirements are such. The f3 clock used to clear out the output serial register has to be fast enough to enable the serial propagation of all the information contained in the output serial register before the transfer of new information from the storage registers to the output serial register. [Clock f3, like clocks f1 and f2, may include several phases.]

Figure 2:
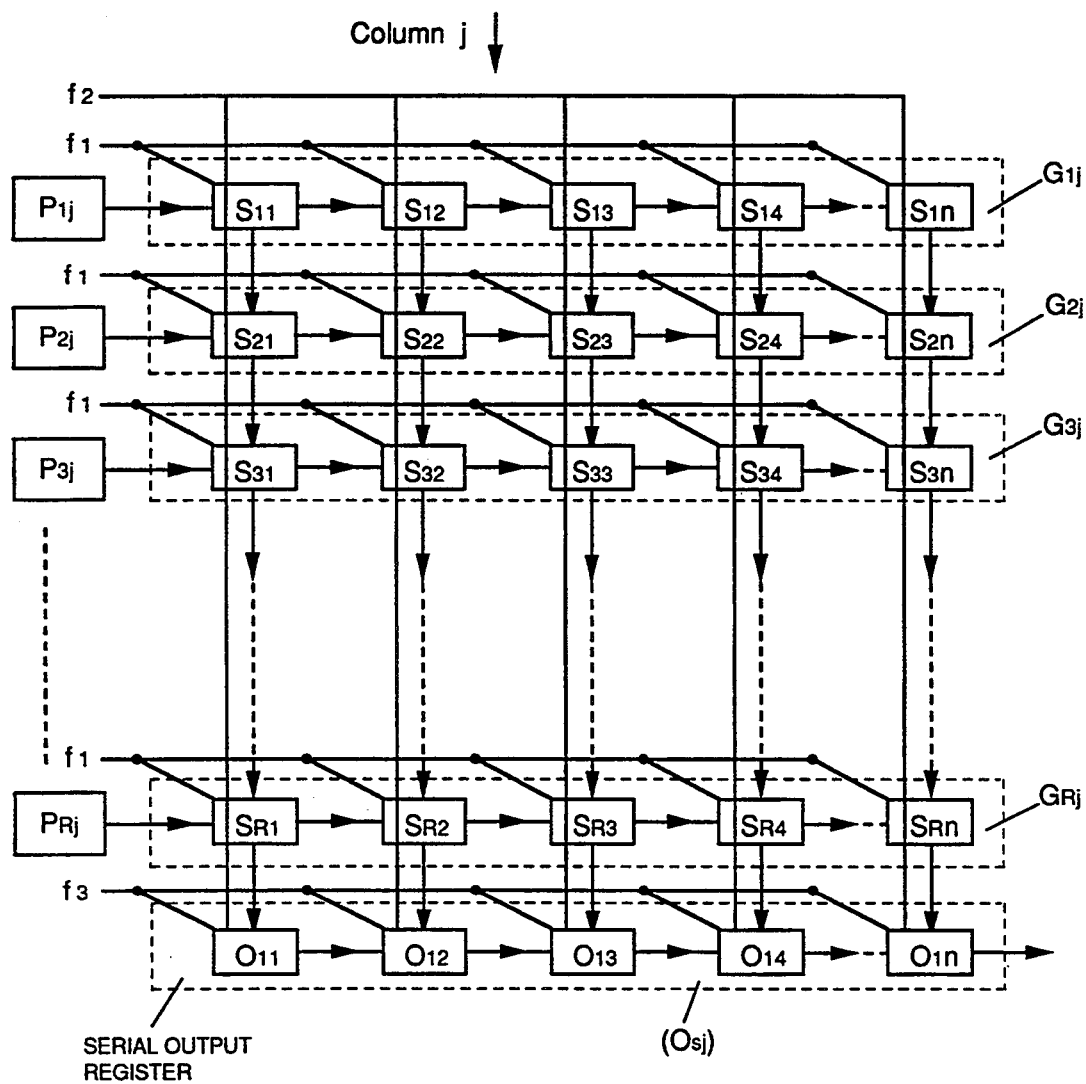
FIG. 2 is a block diagram of a portion of one column of a photo imager embodying the invention.
Figure 3:
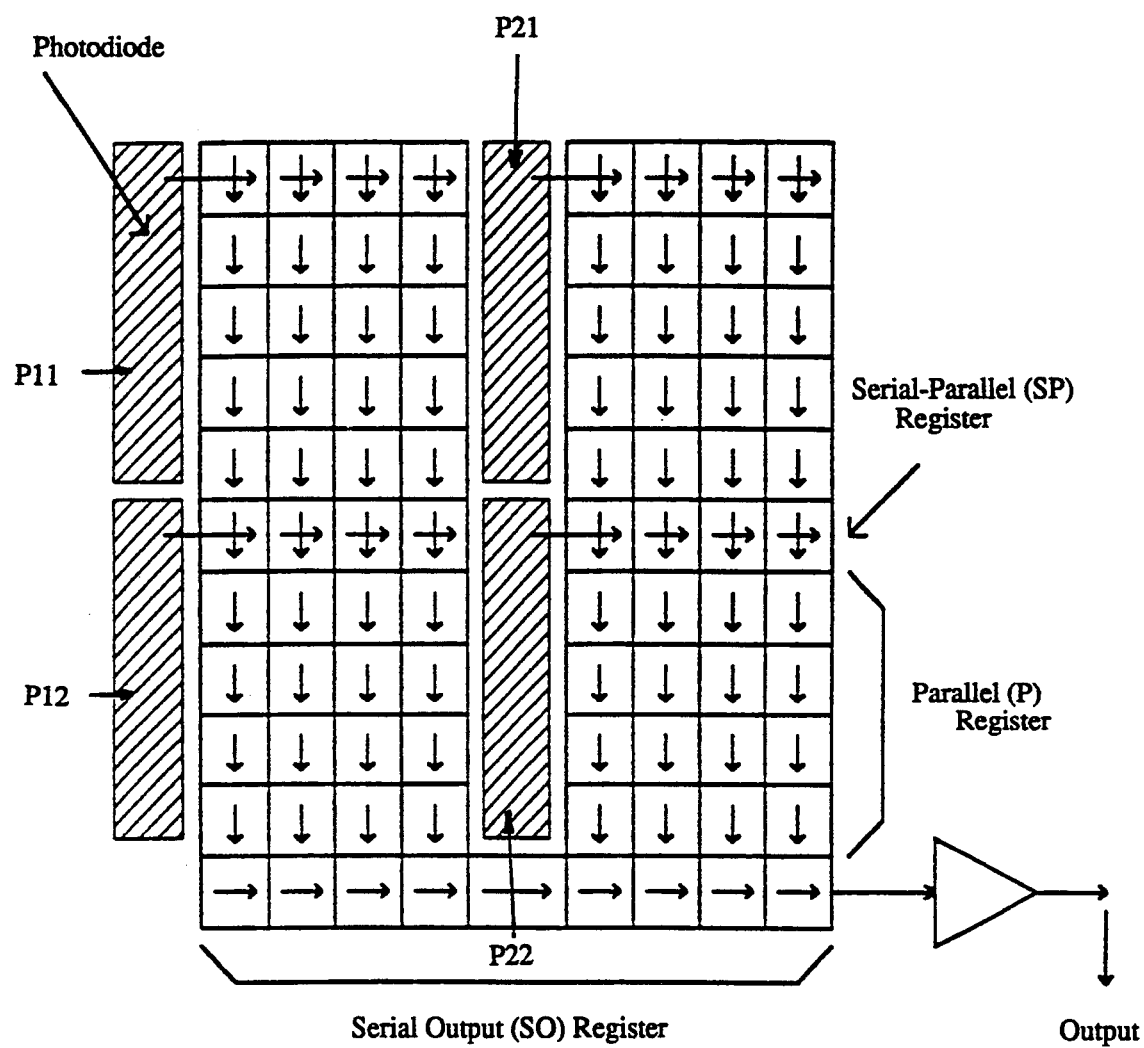
FIG. 3 is a symbolic block diagram representation of a portion of another imager embodying the invention.

The storage registers Gij may be structured to have somewhat different forms as shown in FIGS. 2, 3 and 4 detailed below.

Referring to FIG. 2, there is shown an arrangement of the registers (Gij) for one column of an image sensor embodying the invention. It may be seen from FIG. 2 that for a particular column j, there are "R" rows of the image sensor, where "R" is an integer which may range from a few rows to several hundred rows. Each row includes a photosensor Pij whose output is connected to the input of its associated serial-parallel shift register (Gij) comprised of "N" serially connected storage elements [Spq]Gij, where "N" is an integer which may range from a few stages to several hundred (or more) stages. In the discussion to follow, since the photo information contained in each storage element represents one picture element the information as well as the storage element is sometimes referred to as a "pixel". Also, in the discussion to follow, a photosensor Pij and its associated Gij storage register of N storage elements is sometimes referred to as a "macropixel". During a photo acquisition phase, the photo information produced in, or by, each photosensor (Pij) is transferred by means of a first clocking signal (f1) to the input of its associated serial register (Gij). Photo information produced by Pij or sampled from Pij during each sampling interval (i.e. T1=1/f1) is transferred to the input of the first stage of its associated register Gij. Then, during each succeeding sampling interval, the information contained within the storage register is serially and sequentially advanced from stage to stage. This process is repeated until "N" samples are taken and all N stages of the Gij register are loaded. Thus, N photo samples captured during a time interval which may be equal to N(1/f1) can be stored serially in each serial register Gij associated with each Pij.

It should be noted that each storage register Gij includes N stages. An examination of FIG. 2 indicates that for each column (Cj) there are N stages per row arranged in N sub-columns and R rows. The N storage elements of each register Gij may be identified as (Spq) where p refers to the order of the row and q refers to the order of the sub-column. The storage elements of a register Gij are serially connected whereby all the storage elements Spq of a row (p=i) are connected so the output of one element along a row is coupled to the input of the next element along a row (i.e., end to end). A clock f1 is applied to each register Gij causing information to be transferred serially and sequentially from stage-to-stage along a row. Along the length of each column, each storage element Spq of a row "p" and a sub-column "q" is coupled to a corresponding storage element [S(p+1),q] of the next higher numbered row (p+1) along the same sub-column (q) to permit transfer of information in parallel from storage elements Spq of Gij of a row Ri to storage elements S(p+1,q) of [G(i+1),j] of row R(i+1). Thus it should be understood that during a data acquisition phase the serial registers Gij, function as serial registers, but during read-out they function to propagate the information in parallel. Ergo in the discussion to follow registers Gij, operated in this manner are sometimes referred to as serial(s) or as serial-parallel (SP) registers.

The N stages of the GRj register of the Rth row are coupled to the like numbered N stages of a serial output register (OSj). Each register (OSj) of the serial output register (OS) also has N storage stages, one storage stage corresponding to each one of the N stages of its corresponding GRj register. A second clock signal f2 is coupled to the storage elements of each sub column and to the serial output register for selectively transferring data from the storage elements of one row to the like numbered storage elements of the next higher numbered row along the same subcolumn and from the highest numbered row (SRi) to the serial output register.

The operation of one column of the image sensor embodying the invention is as follows. During a first sampling time interval, photo information is sampled from each Pij by means of a clock f1 and transferred to its corresponding storage register (Gij). During the next sampling time interval, the photo information in each storage register Gij is advanced by one step and, concurrently, new information sampled from each Pij is transferred to the first stage of each corresponding Gij. This process is repeated until all the stages of the Gij storage register are filled. Subsequently, the photo information is read out of the registers and transferred in parallel from stage-to-stage along each column by means of a clock f2 and then transferred to a serial output register.

Thus, during a data (photo) acquisition phase, photo signals are transferred from each photo sensor (e.g. Pij) to the first storage element (e.g. S1j) of the corresponding serial register (Gij) during one clock cycle of the f1 clock. During succeeding clock cycles of the f1 clock, the signal is transferred serially and sequentially from stage to stage along the serial register. Concurrently, new signals are transferred from the photo sensor and propagated along the register. After N clock cycles the N stages of each storage register (Gij) are loaded with photo information.

After completion of a data acquisition phase, a data transfer (read-out) phase is initiated. In the embodiment of FIG. 2, it is preferable that during read-out no new information be transferred from the photosensors to the storage elements. During the data transfer phase, the storage stages are operated as a large analog memory with the information contained in the storage registers being transferred in parallel from row to row at a frequency f2 which may be different (e.g. lower) than f1. Referring to FIG. 2 it may be appreciated that, during the read-out phase, each subcolumn functions essentially as a serial register enabling the transfer of information from row to row along each subcolumn. The photo information transferred from the Rth storage register (GRi) into the output register (OSj) is read out of the output register by means of a clock signal f3 whose rate will be determined by system considerations. After the contents of the registers are read out, photo information can again be clocked from the photosensors Pij into the storage registers Gij of the imager. For ease of discussion, the clock signals f1, f2, and f3 are shown as a single clock signal applied via, and along, a single line or conductor. It should be appreciated that each clock signal may include several phases, with each (or some) phase of the clocks being applied to their respective elements and registers.

Alternatively to the showing of FIG. 2, the photodiodes (Pij) and their associated storage registers may be organized as shown in FIG. 3 which shows a two row by two column (2×2) array of photodiodes and their storage registers. FIG. 3 is a schematic showing the concept for a 2DCCD fast-frame-rate imager. Four macropixels from a larger array are shown in order to illustrate the concept. The photoelectrons accumulated during an exposure are transferred from each photodiode to adjacent CCD type analog memory array. Each photodiode is shown to cover a rectangular area. Associated with each photodiode and in close proximity to the photodiode is a set (e.g. 20) of storage elements arranged in five subrows with each subrow containing four sub-columns whereby there are 20 storage elements associated with each photodiode. The number of storage elements shown in FIG. 3 is by way of example only, and many more sub-rows and sub-columns could be laid out next to each photo element. As noted above, the totality of storage elements associated with each photodiode is sometimes referred to herein as a "macropixel" while each storage element containing or storing a single picture element is sometimes referred to herein as a "pixel".

Figure 4A:
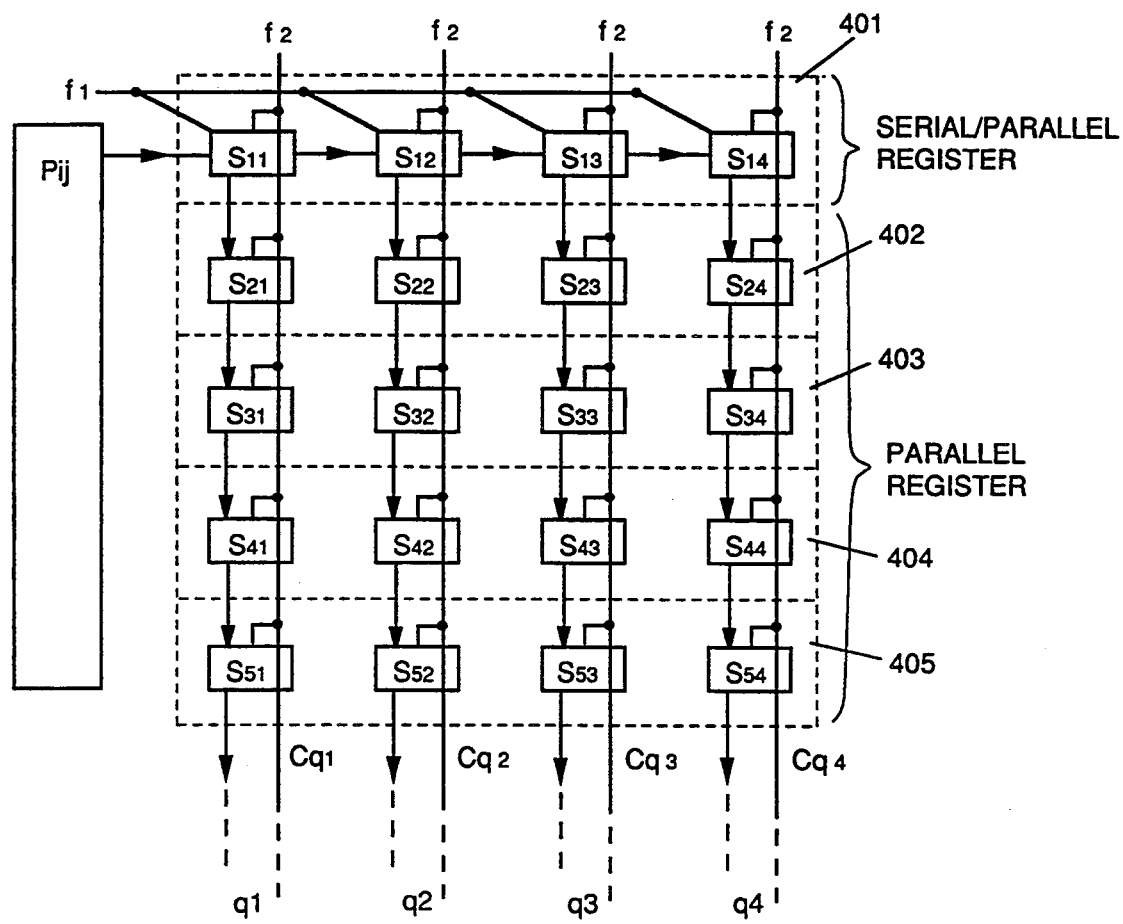
FIG. 4A is a block diagram detailing a form of the serial and parallel registers associated with each photodiode of the imager of FIG. 3.

The storage registers of one macropixel of the imager of FIG. 3 may be organized as shown in FIG. 4A. In FIG. 4A there is shown a first sub-row 401 whose storage elements are interconnected to enable the serial and sequential propagation of signals along the subrow. A clock signal f1 is applied to the storage elements of the first sub-row whereby during one clock cycle the photo information produced by Pij is sampled and transferred from Pij to the first storage element S11 and then during each subsequent clock cycle from stage to stage until the last stage (e.g. S14) of the first sub-row is filled.

The four storage elements of each sub-row are arranged to form four sub-columns (q1, q2, q3 and q4). Thus, in addition to sub-row 401, there are four additional sub-rows (402, 403, 404 and 405), each containing four storage elements arranged to form four sub-columns. The storage elements along each sub-column (e.g., q) are interconnected such that the output of the storage element in sub-row "p" along sub-column "q" is transferred to the storage element in subrow (p+1) along sub-column q. As shown in FIG. 4A, a clock f2 is applied to sub-column conductors Cq1, Cq2, Cq3 and Cq4, with each sub-column conductor being connected to all the storage elements along its column. Under control of the f2 clock, signals may be transferred in parallel from a sub-row to the next sub-row along the same sub-column.

An image sensor of the type shown in FIG. 4A, may be programmed to operate as follows during a photo or image acquisition phase. Firstly, under the control of an f1 clock, photo signals from each Pij are sampled and transferred to the 4 stages of first subrow 401 which are filled up serially by means of clock f1. When all the stages (storage elements) in register 401 are loaded, the information in the storage stages of subrow 401 is transferred in parallel under the control of a clock f2 from serial subrow 401 to the next subrow 402. Thus sub-row 401 functions as a serial accumulation register and as a parallel transfer register during a data acquisition phase. For this reason, register 401 and like registers are sometimes referred to herein as a "serial" register or as a "serial parallel" register, depending on the function being performed. After the transfer of information from register 401 to register 402, serial register 401 is again filled up. After 401 is filled up again, the information in 402 is advanced, by means of clock f2, from row 402 to row 403 and the information in row 401 advances to row 402. This process is repeated until all the storage elements associated with each macropixel are loaded. That is, photo information has been transferred to all the storage elements in rows 401, 402, 403 404 and 405. When all the macropixels in the imager have been loaded, a read-out phase is initiated.

During the read-out phase, the information contained in each macropixel is transferred from row-to-row under the control of a clock signal (e.g., f2) to an output serial register of the type shown in FIGS. 1 and 2. During the read-out phase, all the registers including register 401 are operated as parallel registers. But, during image acquisition serial register 401 functions as a serial register whose information is periodically read out in parallel.

Figure 4B:
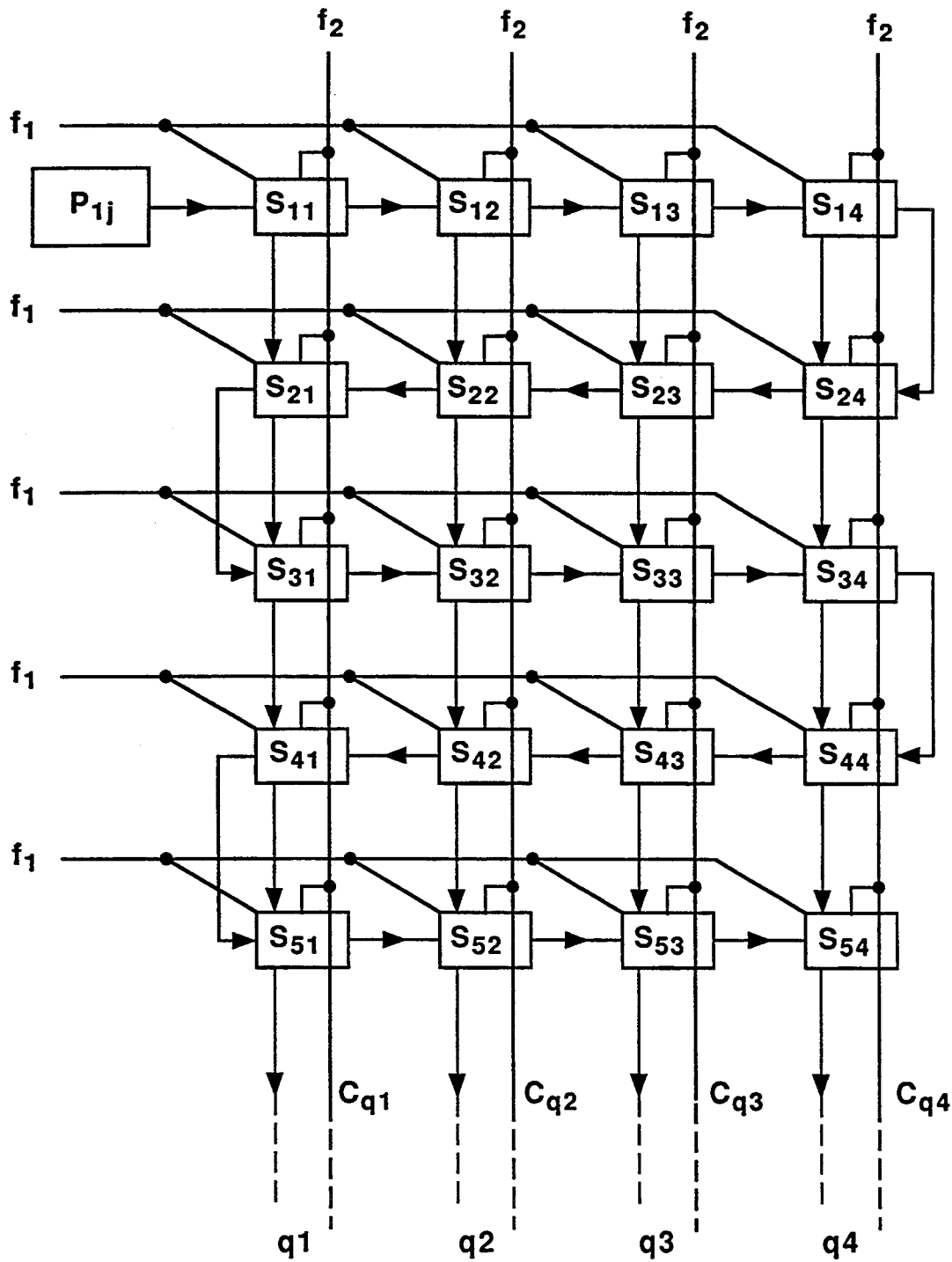
FIG. 4B is a block diagram detailing another form of serial/parallel register useable with the imager of FIG. 3.

In FIG. 4B there is shown a modification of the structure of FIGS. 3 and 4A wherein the storage elements of a macropixel are interconnected end to end. That is, the last stage of each subrow is connected to the input of the next subrow essentially forming a serial register of the type shown in FIG. 2. In FIG. 4B, during the data acquisition phase, all the storage elements of each macropixel are clocked at a rate f1 and photo data is transferred from the photosensor elements into the serial register until all the storage elements of the macropixel are loaded. When all the storage elements of each macropixel are loaded the storage elements function as a large analog memory. The read out of the analog memory is accomplished by reading (transferring) the contents in parallel from sub-row to sub-row along each column into the output register. The information in the output register is then transferred serially to one or more output amplifiers. An advantage to having "serial" registers of the type shown in FIGS. 2, 4A and 4B, is that such registers permit a charge dump at the end of each register. In FIGS. 2 and 4B, the charge dump would preferably be located at the output of the nth stage (e.g., S1n in FIG. 2, S54 in FIG. 4B). In FIG. 4A, the charge dump is preferably located at the output of the last stage (e.g., S14) of the serial parallel stage 401. The availability of a charge "dump" at the end of the serial register of a macropixel allows for lead time in capturing of a transient imaging event as discussed below.

It should therefore be appreciated that photosensors embodying the invention may be operated to sense and record photo information at a very high frame rate, where a frame includes all the photo information obtained and stored during one clock (f1) cycle. "N" frames of information may be obtained and stored so as to be read out and processed at a different rate (e.g., f2) than the photo acquisition rate and at a subsequent more convenient time.

In FIGS. 1, 2, 3, 4A, and 4B information is serially transferred from each photodiode to its associated storage register with each register functioning as a local analog memory for its photodiode. Once the storage registers are loaded, their information is transferred in parallel along columns (and sub-columns) from row-to-row until the information is again transferred to an output serial register.

Figure 5A:
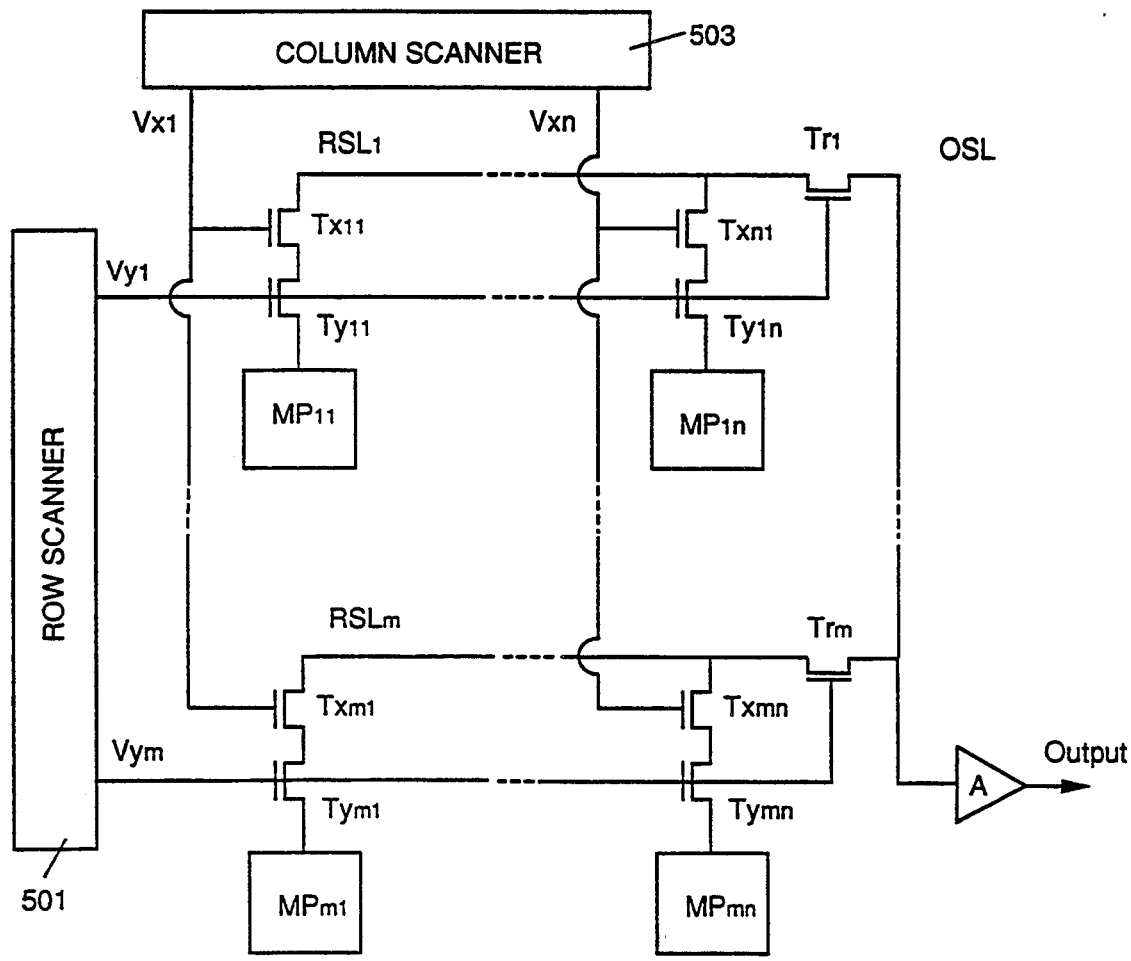
FIG. 5A is a semi-schematic semi-block diagram of an X-Y organized image sensor embodying the invention.

FIG. 5A is a diagram in semi-block, semi-schematic form of a high frame rate imager comprising an "m" by "n" array of macropixels (MPij). The macropixels (MPij) are selected by X-Y addressed MOS switches (Txij and Tyij) for coupling the macropixels of each row (mi) to a corresponding row sense line (RSLi). The turn-on and turn-off of the X-Y switches is accomplished by means of a row scanner 501 and column scanner 503, which may be of standard (conventional) form and function. Each row sense line (RSLi) is coupled via a row select switching transistor (TRi) to an output sense line (OSL) which is connected to an amplifier (A). As noted above, with respect to FIG. 1, to increase the speed of processing of the data, each row sense line may be coupled to its own amplifier, or a small group of row sense lines may be coupled to their own amplifier.

Figure 5B:
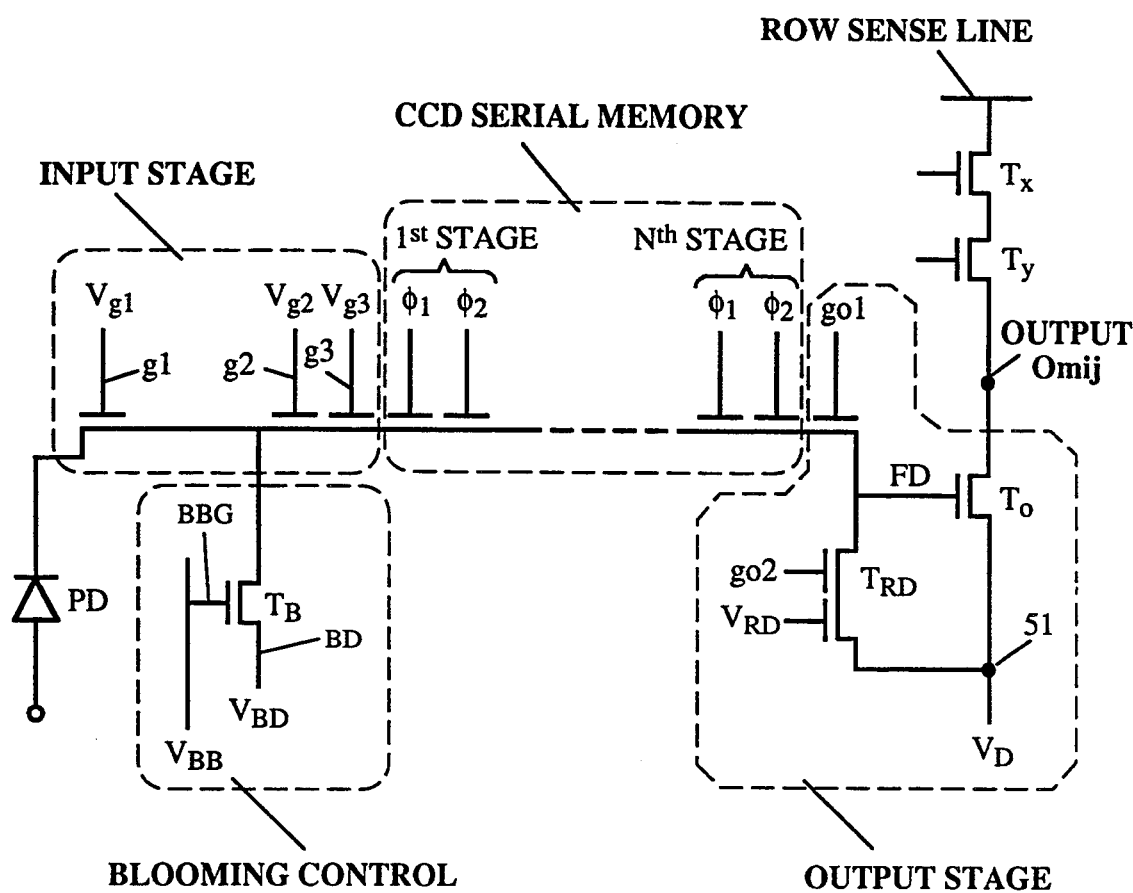
FIG. 5B is a schematic diagram of a macropixel embodying the invention, useable in image sensors of the type shown in FIG. 5A.

As shown in FIG. 5B, each macropixel (MPij) includes a photodiode, PD, a CCD input stage, a blooming control network, a CCD serial memory (SM), an output stage, and MOS switches for selectively coupling the macropixel to its associated row sense line. Except for MOS switches Tx and Ty, the macropixel shown in FIG. 5B with appropriate modification for parallel read-out or other form of read-out may also be used to form the basic serial registers in FIGS. 1 and 3.

The CCD input stage of each macropixel includes a gate g1, a gate g2, and a gate g3. A voltage Vg1 which may be a constant voltage or a pulse as shown in FIGS. 14B2 or 14C2, is applied to gate g1 for controlling the transfer of the charge from the photodetector, PD, to a CCD input-well under a gate, g2. A voltage Vg2 is applied to gate g2 for accumulating charge from the sensor,. PD, and for storing and controlling the detected charge signal. The gate g3 controlled by Vg3 separates the operation of the CCD input stage from the CCD phase clocks 01 and 02. The CCD input stage also includes a blooming control structure that also performs the function of an electronic shutter. The blooming control structure as shown in FIG. 14D1 includes a blooming control gate gbb which overlaps the gate gb. In FIG. 5B, this is shown schematically as a transistor TB with a blooming drain, BD, to which is applied a bias voltage, VBD, and a blooming barrier gate, BBG, to which is applied a control voltage, VBB. The CCD input channel under gate g1 is directly connected to the potential well region under gate g2 to which is applied a control voltage Vg2. The detected charge accumulated under gate g2 is then transferred along the register under control of voltage Vg3 applied to the gate g3. The charge signal under g3 is propagated along the serial CCD memory which in FIG. 5B is shown to be controlled by a two-phase CCD clock with clock voltages 01 and 02. It should however be understood that the serial CCD memory may be controlled by different types of control clocks (e.g., one- phase, three-phase or four-phase) applied to or generated by the imager. During the data acquisition phase, the CCD serial memory functions like the Gij registers of FIG. 2. Each CCD serial memory may be comprised of N analog memory stages, each stage capable of sequentially accepting, storing and transferring data (photo) signals at a first (fast) rate.

The output stage of the CCD serial memory shown in FIG. 5B is a form of floating diffusion amplifier (FDA) described in U.S. Pat. No. 4,646,119 to Kosonocky, whose teachings are incorporated herein by reference.

The output stage of the macropixel includes a floating diffusion, FD, connected to the gate of a source follower transistor, $T_O$. A reset gate shown as a transistor, TRD, has its source-to-drain path connected between the floating diffusion (FD) and a DC bias voltage, VD. A voltage VRD applied to the gate of TRD may be used to clamp FD to the bias voltage VD. DC-biased output gates gO1 and gO2 to which are applied voltages VO1 and VO2 (see FIGS. 5B,5C, and 15) isolate the floating diffusion, FD, from clock phase 02 and reset drain pulse VRD. The drain region 51 of TRD to which is applied VD volts performs the function of the "dump drain" since charge signals being transferred along the CCD serial memory are "dumped" into this drain during normal operation of the floating diffusion amplifier by turning-on TRD. Source follower $T_O$ has its drain connected to VD and its source to the output (Omij) of the macropixel. Source follower, $T_0$, functions to convert the charge signal periodically deposited on the FD node into an output voltage at its source which is connected to output terminal Omij. Use of an output stage of the type shown in FIG. 5B avoids the relatively large noise associated with MOS switches since the photo charge signal present on the small capacitance of the floating diffusion (FD) node is isolated from the larger capacitance and voltage at the source of $T_O$.

The readout of a serial register can also include a still further reduction of noise by correlated data sampling (CDS). For this method, each frame would be read out twice. First, after resetting of the floating diffusion (FD) and then again after the charge signal is introduced onto the FD node. For this method, the reset noise placed on the FD node during the resetting of the FD node is subtracted from the output signal that contains the detected charge signal plus the reset noise. Of course, this requires an external frame memory for storing the reset noise frame as disclosed by J. Edwards et al. in an article titled "244×400 Element Hybrid Platinum Silicide Schottky Focal Plane Array", SPIE Proc., Vol. 1308, pp. 33–110, Orlando, Fla., April 1990.

As shown in FIG. 5B, each macropixel output (Omij) is coupled via a row select (e.g., Ty) MOSFET switch and a column select (e.g., Tx) MOSFET switch to a row sense line. The selection of particular macropixels for read out onto the row sense lines is accomplished by means of the signals generated by row scanner 501 and column scanner 503 shown in FIG. 5A. Normally, only one macropixel along a row is selected and coupled, at any one time, to a particular row sense line.

Thus, for each macropixel, the photo signals propagated along and stored within the CCD serial memory are read out from the output stage which is coupled via X-Y addressed MOSFET switches Txij and Tyij to the row sense line RLSi.

During an image sensing period, photogenerated charge is transferred from the photodiode PD to the serial CCD memory at a high clock rate under the control of Vg1, Vg2, Vg3, 01, 02, VBB and VRD. During image sensing, typical voltages applied to the buried-channel CCD serial memory register are: Vg1 is at 0 volts for charge read out and −5 V for decoupling the photodiode from the input well under the g2 gate; Vg2 is at +2 volts; VBB is at −3 volts or at a voltage that assures that the maximum charge signal does not exceed the capacity of the serial register; VRD is at +5 volts; Vg3, 01 and 02 swing between plus and minus 5 volts; and VBD is at +10 volts. All of the above voltage pulses are applied (in parallel) to all macropixels. It should be noted that the operation and construction of the input stage of the CCD serial memory register can be similar to that illustrated in FIG. 14.

Figure 5C:
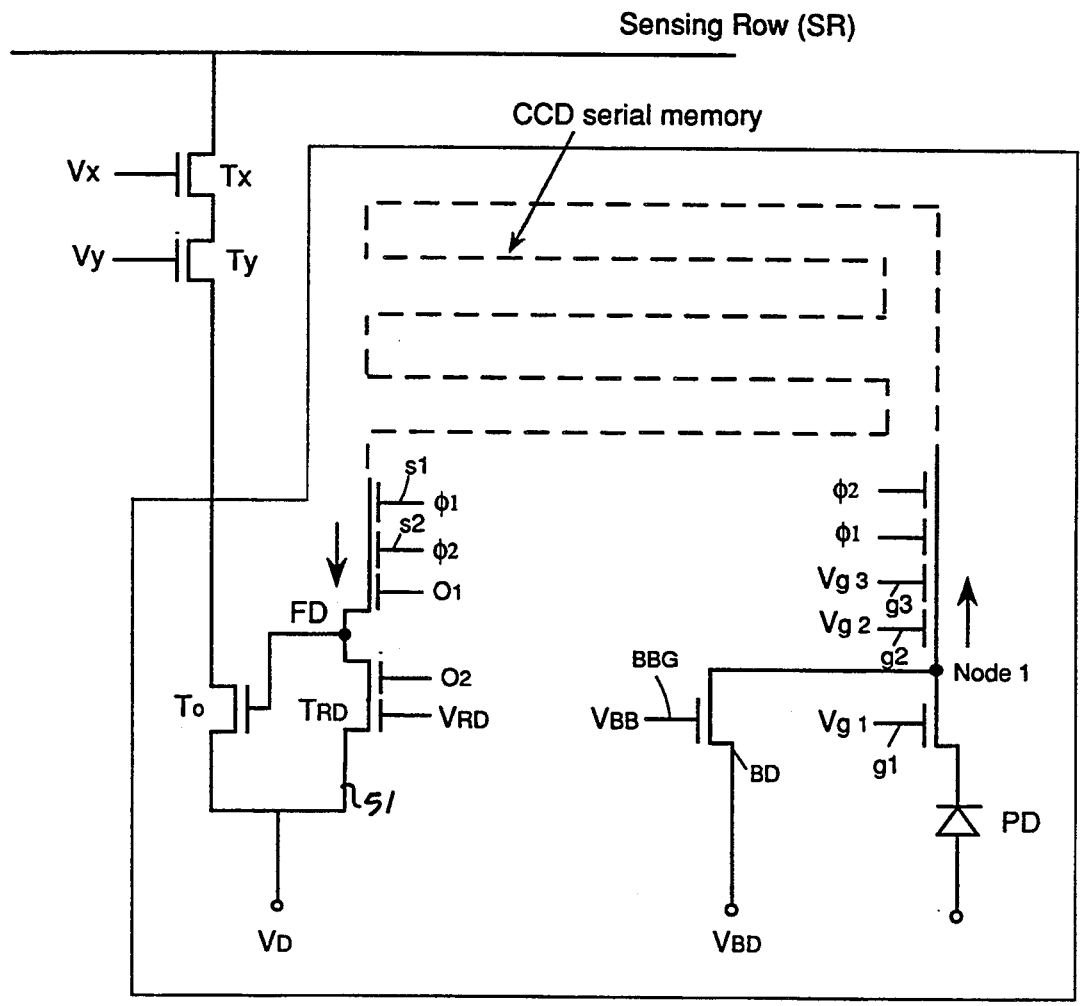
FIG. 5C is a schematic diagram of the macropixel of FIG. 5B with the CCD register having a serpentine-like shape.

The serial CCD memory in FIGS. 5B and 5C is illustrated as having a 2-phase CCD construction. However, it should be understood that the serial CCD memory can be implemented using any of the CCD gate structures shown in FIG. 6. That is, the serial CCD memory may include a Virtual Phase (1-phase), 2-phase, 3-phase or 4-phase CCDs.

During a frame readout period, the output of the photodiode may be deactivated by the electronic shutter action of the blooming control structure by having VBB go from $-3$ volts to $+5$ volts while the voltage Vg1 is held at 0 volts and Vg3 applied to the gate g3 is held at $-5$ V. Concurrently, the contents of the CCD serial memory may be read out onto its associated row sense line. During read-out, Vg1 may be maintained at 0 volts, Vg2 at $+2$ volts, VBB at $+5$ volts, Vg3 at $-5$ volts, and the phase clocks 01 and 02 and VRD are switched between $+5$ volts and $-5$ volts. The read-out of the CCD memory is accomplished by turning on the Tx and Ty switches coupling the macropixel to the associated row sense line. The read-out of each macropixel includes the selection of rows by the row scanner 501, which produces voltage pulses Vyi. This is followed by selection of pixels along a selected row by the column scanner 503 producing voltage pulses Vxj. Referring to FIG. 5A, during read-out the row selection pulses Vyi are also applied to the row output MOSFET switches Tri which connect the row sensing lines (RSLi) to an output sensing line (OSL). The output can be sensed at the OSL either through an amplifier A as shown in FIG. 5A or directly.

The high frame rate imager with a serial CCD memory in each macropixel and an X-Y addressable MOSFET readout has the advantage of providing an output signal that is already reformatted frame by frame.

Another advantage of the macropixel with serial CCD memory is that it allows a very long "lead time" for capturing the beginning of an imaging event of interest. In this case, during the data acquisition cycle of the imager, the serial CCD memory will be continuously clocked in anticipation of the event of interest to be captured by the imager. During such operation, the charge samples detected by the photodiode will be stored by the serial CCD memory. When the memory capacity is exceeded by the photogenerated charge signals, the oldest charge samples will be dumped into the "dump" drain, 51, to which is applied a voltage VD (see FIGS. 5B and 5C). It should be understood that some other local dump drain may be used in the macropixel illustrated in FIG. 5B or 5C, other than the one at the end of the register.

A general discussion of "lead time" and the function of the "dump drain" follows. In normal operation, to record an event of interest, an initiate command starts transfer from the photo diodes to the serial registers under the control of "fast" (e.g., f1) clock signals. The transfer of photo information continues for a timed interval. Then, a stop command is given, interrupting the "fast" clocks and charge transfer from the photodetectors to the storage registers. Then, a read command starts the read-out process at, typically, a slower clocking rate.

The fact that the serial CCD memory may be full of the most recent photosensor output data is invaluable in that it provides the very useful feature of "lead time" in capturing transient events the occurrence of which may not be known until some short time has passed. (The inception of spontaneous events such as cavitation of a propeller is one example.) In imagers of the type using the "full" length of the serial registers as shown in FIGS. 2, 4B, 5A, 5B or 5C, the lead time is up to $N \times T$ where T is the photodiode clocking interval and N is the number of storage elements in the serial storage register. That is, the imager may accumulate up to N frames of information representing a time $N \times T$ before signal is available indicating that a transient event of interest has started. Once the starting time of the transient event is detected, a command can be given to the imager for timing the image acquisition cycle so that the image transfer of interest can be acquired and then subsequently read out at a slower rate.

In the case of a macropixel with a serial-parallel storage array (such as illustrated in FIGS. 3 and 4A) a dump drain for the overflow charge samples can be conveniently placed only at the end of the first subrow of a serial (or SP) register of the type identified as 401 in FIG. 4A. In this case, the lead time is limited to nT where n is the number of stages of the first subrow serial register and T is the photodiode clocking interval, or the period of the serial register clock.

The CCD serial memory register of FIG. 5B may be formed to have a serpentine-like (or multiple S-like) shape as shown in FIG. 5C. This type of structure would enable the serial register to be formed physically near or wrapped around the photodiode so that the appearance of the imager would be akin to that shown in FIG. 3.

Alternatively, each serial CCD register could also be configured as shown in FIGS. 5D1 and 5D2. The structure of FIG. 5D1 provides a form of serial-to-parallel-to serial (SPS) transfers between the input and the output of the register. The structure of FIG. 5D2 provides serial-to-parallel transfers and then back up the parallel registers for a parallel-to-serial transfer to the output (i.e. S-to-P and P-to-S).

The photosensor arrays embodying the invention may be implemented using any one of a large number of different CCD technologies including any one of those illustrated in FIGS. 6A through 6F.

Figure 6A:
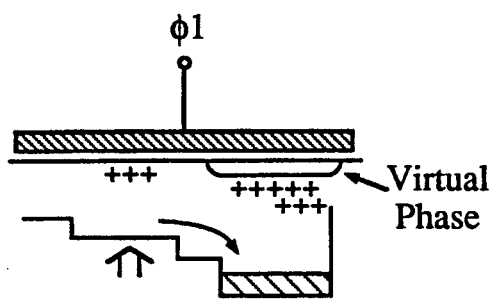
FIGS. 6A through 6F are outlines of six different CCD technologies which may be used to manufacture photo imagers embodying the invention.

FIG. 6A shows what is commonly known as "Virtual Phase" CCD technology. The advantage of devices formed in accordance with this technology is that they can be made and operated with one level of polysilicon gates and can transfer charge signal with only one clock (01). The direction of the signal flow and charge storage in the case of virtual phase CCD is accomplished by a combination of n-type and p-type implants. Construction of a one phase virtual-phase CCD register requires four minimum design rules (MDRs) to form a fixed CCD-well in the form of a storage region with a transfer barrier and clocked CCD-well that includes a storage region and a transfer region.

Figure 6B:
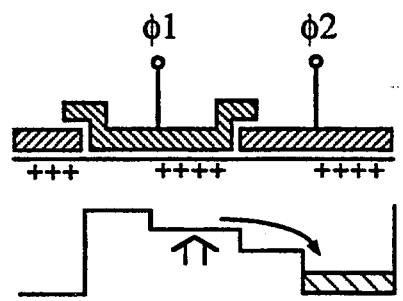

FIG. 6B shows a "Coplanar two-phase" CCD technology with implanted barriers. The advantage of this technology (like that of the "virtual phase CCD") is that a CCD register may be constructed using a 2-phase (01,02) coplanar CCD technology with two levels of polysilicon with four minimum design rules (MDRs) per stage of the register.

Figure 6C:
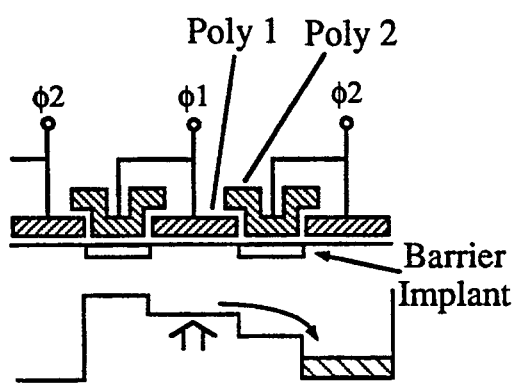

FIG. 6C shows a "standard two-phase" CCD technology having two level polysilicon gate structures with implanted barriers.

Figure 6D:
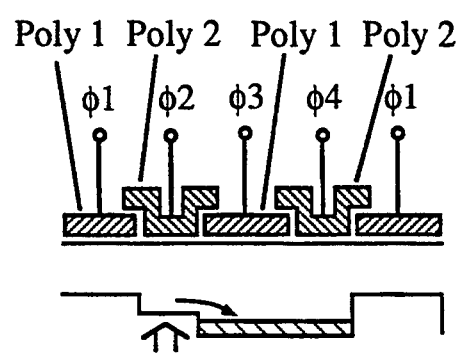

FIG. 6D shows a two-level polysilicon 4-phase (double-clocked) CCD gate structure.

Figure 6E:
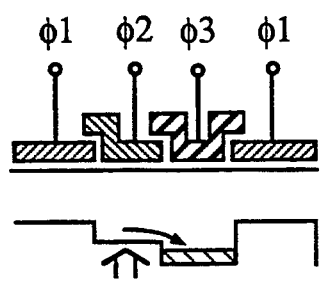
Figure 6F:
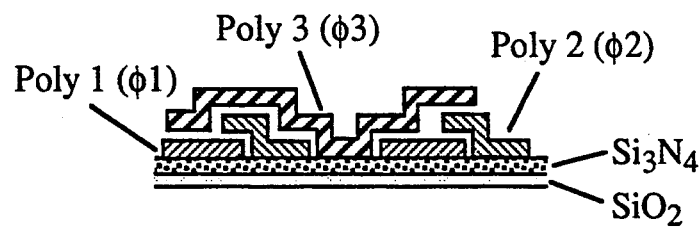

FIGS. 6E and 6F show a three-phase (01,02,03) CCD which can be implemented efficiently with three-level polysilicon gate (Poly 1, Poly 2, Poly 3) structures.

The selection of a particular technology is typically based on the considerations discussed below.

Assuming the poly-1/poly-2 overlap is equal to ½ design rule, the 2-phase CCD in FIG. 6C and the four-phase CCD in FIG. 6D can be constructed with 6 Minimum Design Rules (minimum defined dimensions). The two-phase CCDs in FIGS. 6B and 6C have the advantage of requiring simple and very non-critical clock waveforms which is very useful for high clock rate. The four-phase CCD in FIG. 6D allows the maximum charge storage corresponding to two CCD gates. However, the highest packing density defined as the highest number of stages per unit area can be achieved with the 3-phase CCD shown in FIGS. 6E and 6F. This type of structure requires only 3 MDRs and enables moderate charge storage capability, corresponding to one third CCD stage. A 3-phase CCD constructed with three levels of polysilicon, see FIG. 6F, also provides a high yield CCD process that, similar to the two- phase coplanar CCD case, can tolerate some intra-polysilicon shorts.

In the design of serial-parallel (SP) registers of FIGS. 1 through 4B embodying the invention and employing any one of the CCD gate structures outlined in FIGS. 6A through 6F, it is desirable to use an additional level of polysilicon gates. The "additional" level of polysilicon gates functions to provide channel stops during the serial (horizontal) charge transfers and function to provide parallel (vertical) charge transfer from row to row or from sub-row to sub-row to conduct the parallel clocks effectuating the parallel transfer. That is, in CCD structures used to form imagers embodying the invention the same gate structure is used to effectuate either serial or parallel transfers.

Several examples of the construction of the serial-parallel (SP) registers for the architecture discussed in FIGS. 3 and 4A are discussed below.

Figure 7A:
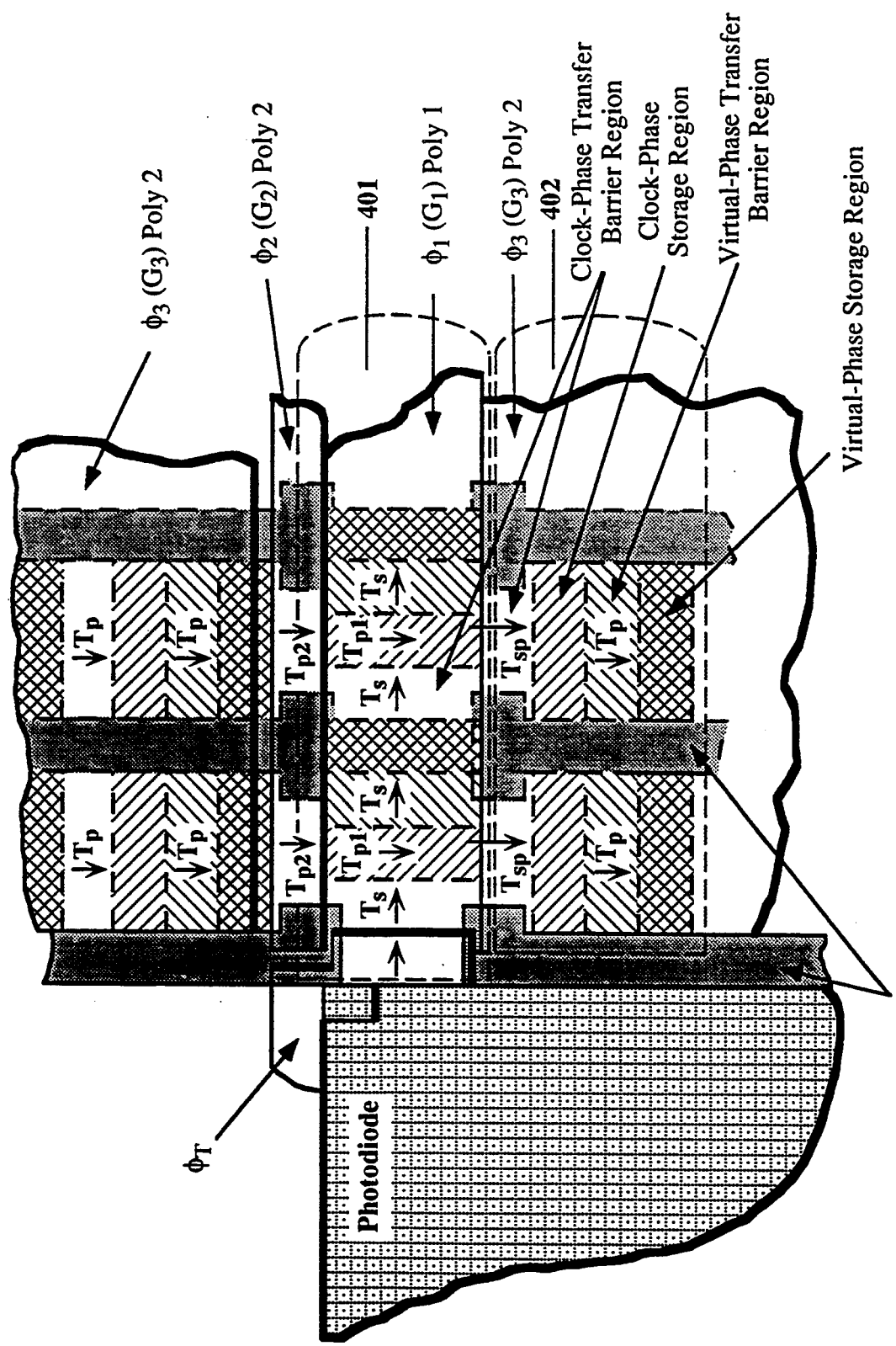
FIG. 7A is a top view of a portion of a virtual phase CCD serial-parallel register which may be used to practice the invention.

Referring to FIG. 7A, there is shown an example of a virtual phase CCD serial-parallel (SP) register design using an "additional" second level of polysilicon (Poly-2) for the G2 gates clocked by 02 and the G3 gate clocked by 03. This SP register could be formed with each storage element being 4 microns by 4 microns, assuming 1 micron minimum design rules (MDRs).

FIG. 7A illustrates the construction of an SP register design using a virtual phase CCD gate structure (technology) of the type shown in FIG. 6A. The basic structure of a virtual phase CCD gate structure may be modified as shown in FIG. 7A to form a serial-parallel storage register. The virtual phase CCD gate structure is modified to include two levels of polysilicon gates and three clock phases (01, 02 and 03). In this case, the serial register transfers (Ts in FIG. 7A) take place under the control of the serial clock 01 shown in FIG. 7B.

Figure 7B:
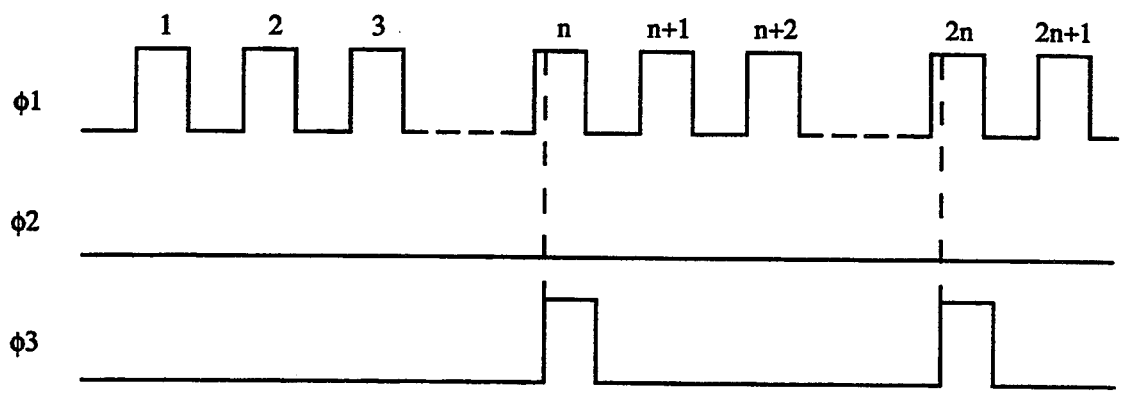
FIG. 7B is a diagram of clocking signals to operate the register of FIG. 7A during an image acquisition period.

As illustrated in FIG. 7B during the serial transfer period under the control of clock 01, the clocks 02 and 03 are in the low voltage state forming low voltage barriers above the serial register under the poly-2-G2 gate to which is applied 02 and below the serial register under the poly-2-(G3) gate to which is applied 03.

Note that, during the nth pulse of the 01 clock, as shown in FIG. 7B, the 03 clock phase goes high initiating a serial-to-parallel transfer-Tsp (see Tsp in FIG. 7A) from the serial register down to the parallel register. At this point, it should be noted that in the operation of the macropixel, the charge signal is normally stored in the parallel register in the "unclocked" half-stage of the virtual phase CCD register when the clock 03 is in the low voltage state. Thus, the transition of the 03 clock to the high voltage state advances the charge signal to the potential well under the clocked half stage. Then, the transition of the 03 clock back to the low voltage state (i.e. at the end of the 03 pulse shown in FIG. 7B or FIG. 7C) results in the transfer of the charge signal to the successive "unclocked" half-stage determined by the combination of p+ and n-type implants (see FIG. 7A).

Figure 7C:
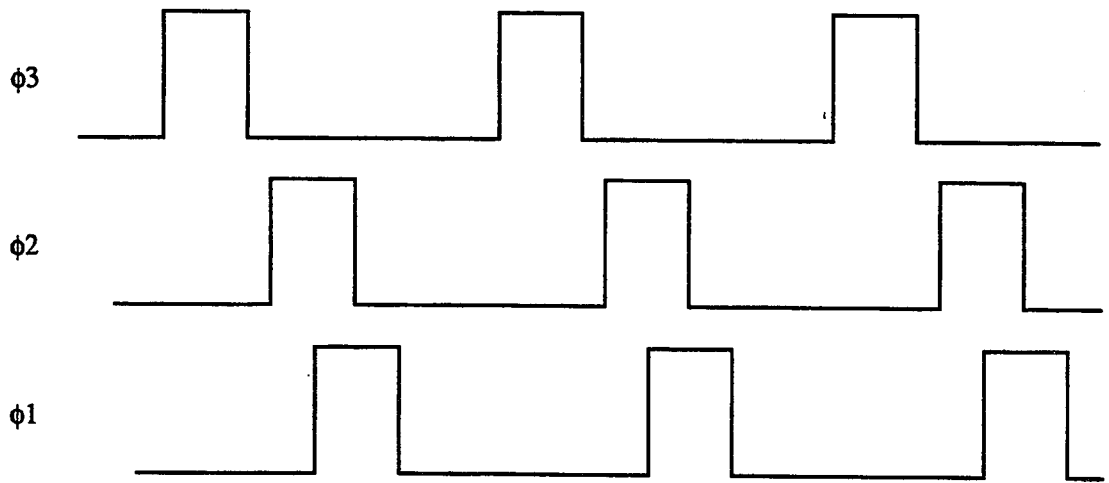
FIG. 7C is a diagram of clocking signals applied to the register of FIG. 7A during a read-out period.

During the charge read-out cycle, after the completion of the image acquisition cycle, the SP registers of all macropixels function as a single large parallel register transferring the detected charge signal into a serial output register. This parallel read-out is accomplished under the control of phase clock 03, 02, an 01 as shown in FIG. 7C. In this case, 03 clock provides the normal parallel transfer (Tp) of charge signal under poly-2 forming gate G3 clocked by 03 (see FIG. 7A) while phase 02 (applied to the gate G2 poly-2) and phase 01 applied to G1 facilitate the parallel transfers (Tp) through the serial register under the poly-1 gate G1. In this operation, the transfer barrier regions of the "unclocked" half stages of the serial register of the G1 gate act as channel stops for enabling the parallel transfers under the G1 gate.

Figure 8:
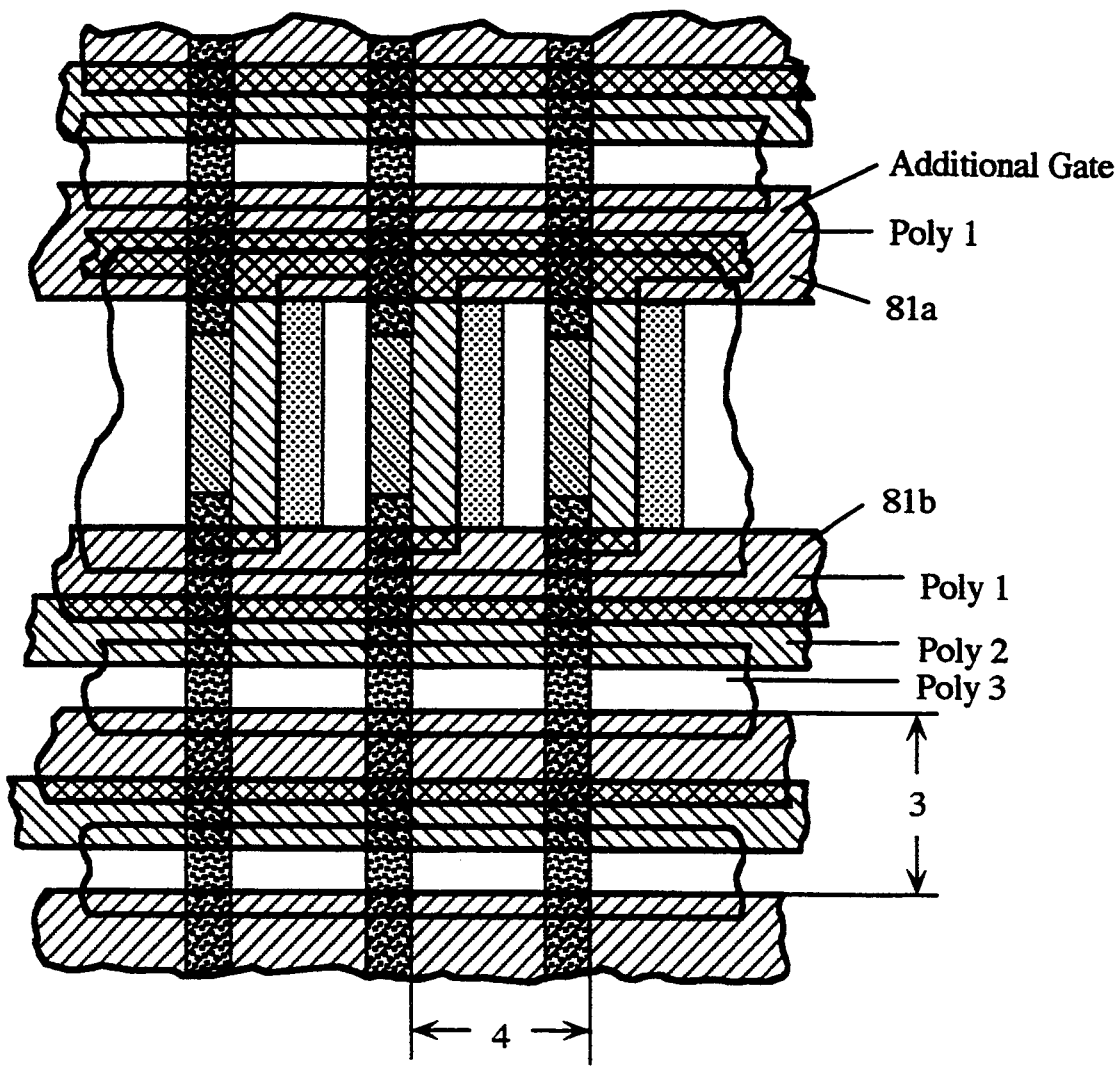
FIG. 8 is a top view of a portion of a serial-parallel register with coplanar 2-phase CCD serial register and 3-phase CCD parallel register.

Referring to FIG. 8, there is shown a portion of a serial-parallel register useful in forming an imager whose architecture is of the type shown in FIGS. 3 and 4A. The imager of FIG. 8 would be formed using an "additional" polysilicon gate with co-planar two-phase CCD for the serial transfer register and a three-phase three-level polysilicon parallel register for the parallel transfer. Each storage element (pixel) could be made to have an area of 4 microns by 3 microns. FIG. 8 shows gates 81a and 81b (formed with a poly-1 level) which function as channel stops during serial transfer and as transfer gates during the parallel transfer.

Figure 9:
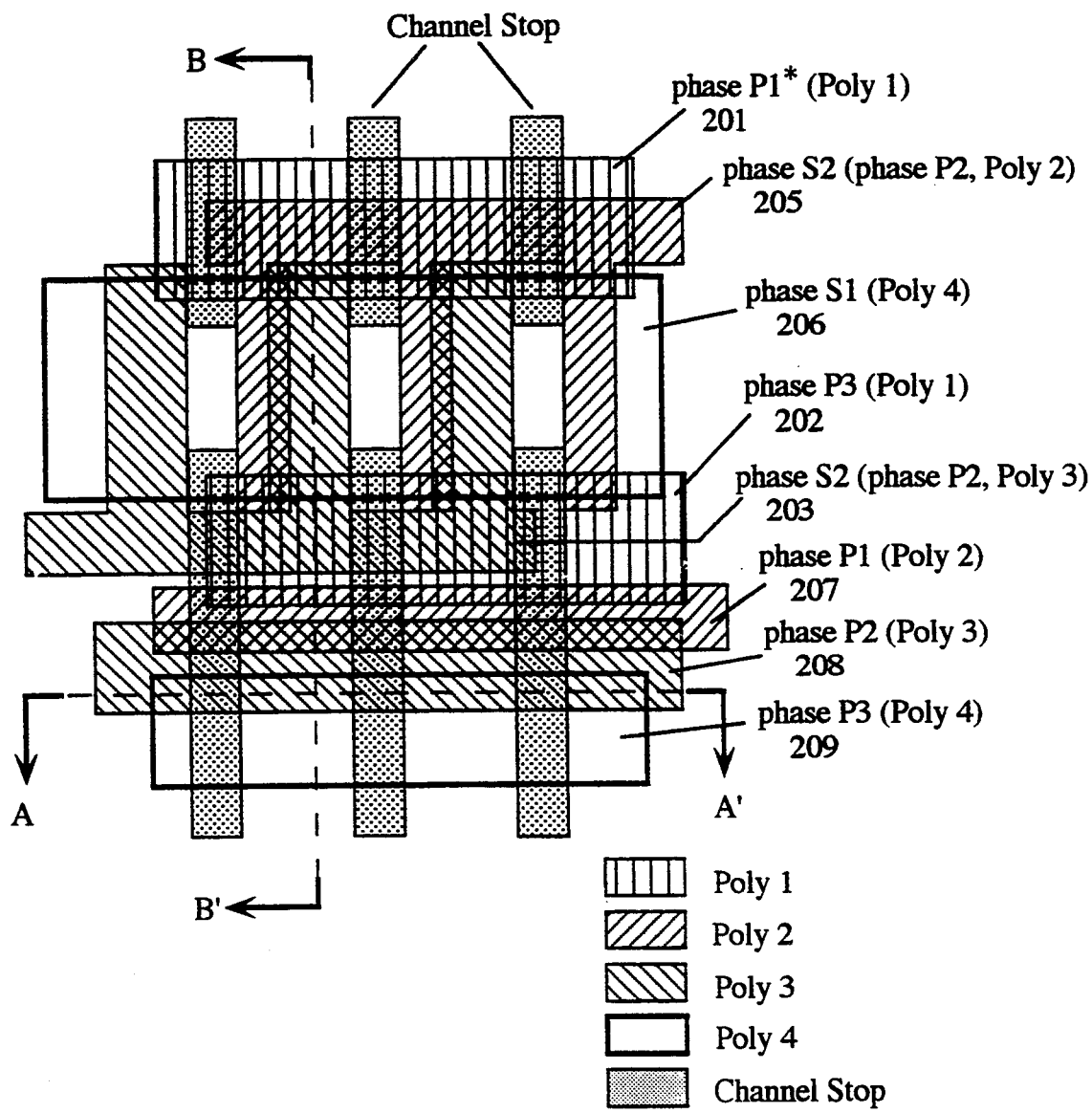
FIG. 9 is a top view of a portion of a serial-to-parallel register employing a three-phase CCD, four-level polysilicon gate construction which may be used to practice the invention.

Referring to FIG. 9 there is shown a portion of the layout of the gate structure of a serial-parallel register formed with 3-phase (S1, S2, S3) CCD technology employing four-level-polysilicon gates (poly 1, poly 2, poly 3 and poly 4). In this design, the first level of polysilicon (poly-1) gates to which are applied clock phases P1 (or P1*) and P3 are used to form channel stops for the operation of the serial register and the other three levels of polysilicon (poly-2, poly-3 and poly-4) to which are applied clock phases S1,S2 and S3 serve as the gates of the 3-phase CCD registers. In this type of structure, each storage element can be made to have an area of 3 MDR by 3 MDRs; where MDR refers to minimum design rules which may range from the submicron range to several microns. The design of FIG. 9 has certain advantages in that it offers the smallest storage element (pixel) size (3 microns by 3 microns—using one micron design rules—), high yield process, and relatively large charge handling capability corresponding to one third of the CCD storage area.

FIGS. 10A1 and 10A2 are two cross-sectional views along A–A' of the serial-parallel (SP) register of FIG. 9. FIGS. 10A1 and 10A2 illustrate two different forms of construction of channel stops for the buried-channel parallel (vertical) CCD register. FIG. 10A1 illustrates buried-channel CCD (BCCD) formed by implanting donor ions arsenic (As) or phosphorous (P) into a p- type silicon substrate. In this case, the surface-channel CCD region form channel stops between the buried-channel vertical CCD registers. An alternate method for defining the vertical buried-channel CCD register is shown in FIG. 10A2. In this case, a single buried-channel implant of phosphorous (P) or arsenic (As) is separated into narrow vertical channels by narrow implants of acceptor ions such as boron (B) for forming the P-regions. It should be noted that typical buried-channel implants are made with As (arsenic) or P (phosphorous) at an implant dose of 1.5 to $3 \times 10^{12}$ ions/cm$^2$ with a range (peak) 0.2 to 0.4 microns below the surface of the silicon.

Figure 10B:
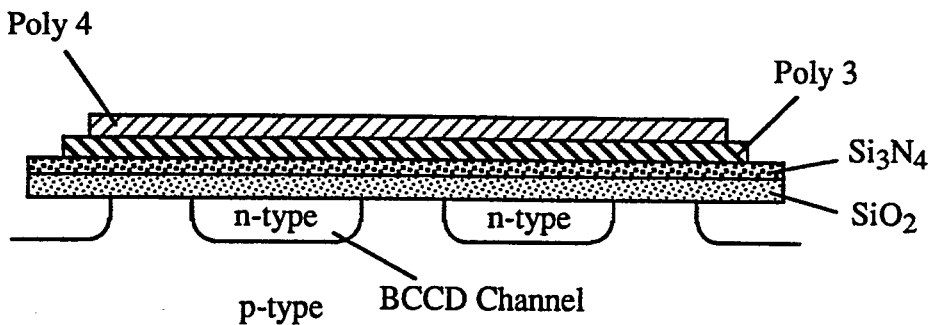
FIG. 10B is a cross section taken along B–B' of FIG. 9 showing the gate structure of the serial and parallel registers.

FIG. 10B shows a cross-section taken across the serial register along B–B' in FIG. 9. Referring to FIG. 10B in conjunction with FIG. 13 which shows clock phase waveforms, note that the first level polysilicon (poly-1) gates 201,202 when biased into the "off" or "low" state by clocks P1* and P3, respectively, form channel stop barriers defining the CCD channel for the serial register. The serial register will then cause charge to be transferred serially along the serial register under the control of clock phase S1 applied to poly-4 gate 206, S2 applied to poly-2 gate 205 and S3 applied to poly-3 gate 203 as also shown in FIG. 9. The cross-section in FIG. 10B also shows poly-2 gate 207 to which is applied phase P1, poly-3 gate 208 to which is applied phase P2 and poly-4 gate 209 to which is applied phase P3 and which define a section of the parallel register. Preferably, the channel oxide (204) for the construction of the imager illustrated in FIGS. 9 and 10 includes a double dielectric in the form of 200 to 600 A$^0$ thick SiO2 (silicon dioxide) covered with about 300 to 600 A$^0$ thick Si3N4 (silicon nitride). The use of silicon nitride permits the construction of a multi-level polysilicon gate structure with essentially constant thickness of channel oxide.

The serial, the serial-to-parallel, and parallel transfer functions formed with the structures shown in FIGS. 9, 10A and 10B which implement the architecture of FIGS. 3 and 4A may be more easily understood by reference to the "conceptual" top view or "gating" representation of FIGS. 10C1 and 10C2.

Figure 13:
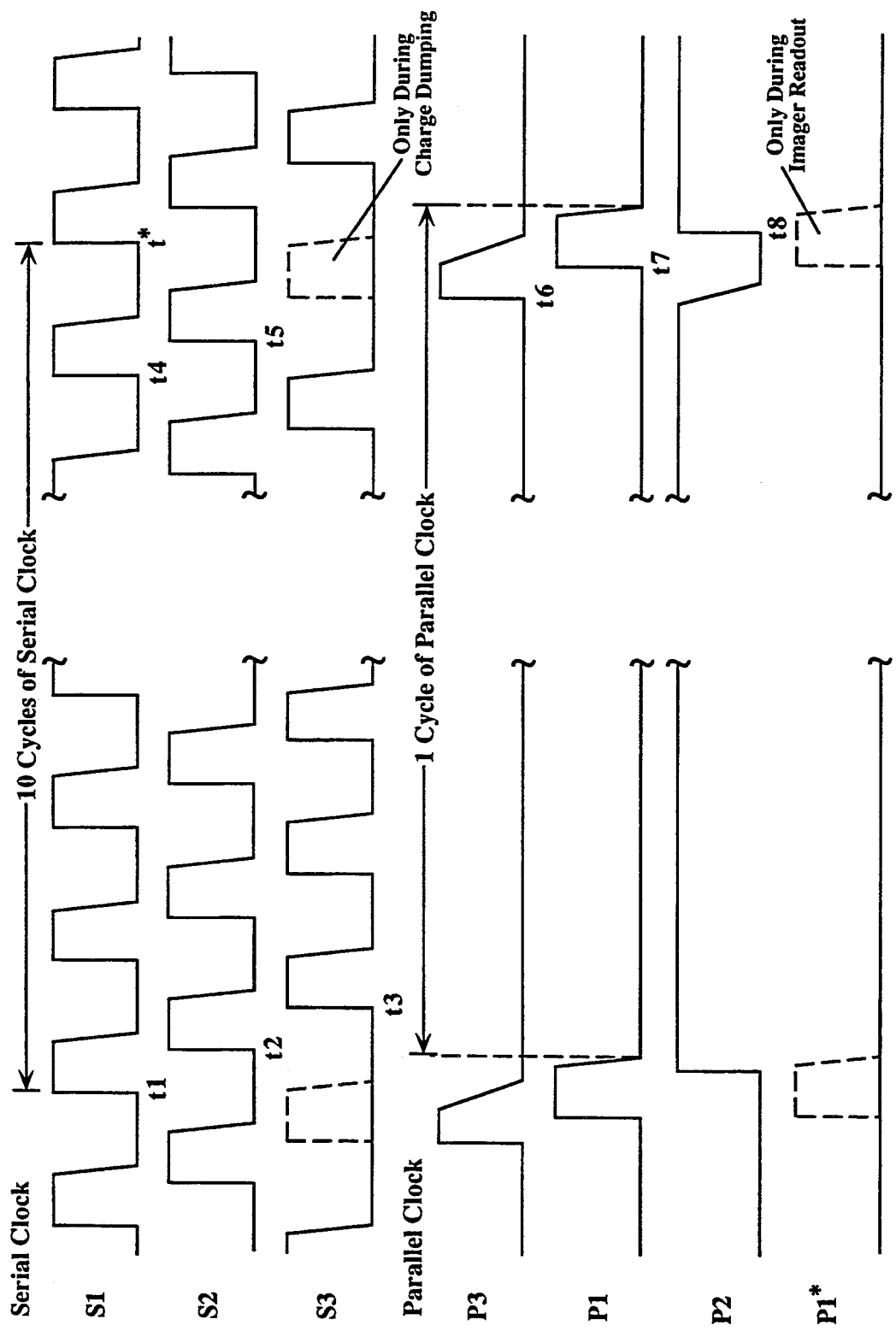
FIG. 13 is a diagram of clocking signals useable in systems employing macropixels of the type shown in FIG. 11.

FIG. 10C1 illustrates how the serial portion of the registers (e.g., 401 in FIG. 4A implemented in accordance with FIGS. 9 and 10B) is clocked during the serial transfer portion of the data acquisition cycle assuming the application of the three-phase serial (S) and parallel (P) clocks shown in FIG. 13. A clock phase P1* is applied to conductor (gate) 201 (formed from poly-1 level) and clock phase P3 is applied to conductor (gate) 202 (also formed from poly-1 level). The voltage levels of clock phases P1* and P3 respectively applied to gates 201 and 202 are such as to form channel stops in the substrate below these conductors (201 and 202) whereby charge signals can not flow in the vertical direction but only within and along a region bounded on top by 201 and on the bottom by 202. The three-phase clocks, comprising S1 applied to every third gate 206 (formed from a poly-4 level), S2 applied to every third gate 205 (formed from a poly-2 level), and S3 applied to every third gate 203 (formed from a poly-3 level) cause charge signals to be transferred serially along the serial path defined by gates 206, 205 and 203. Phases S1, S2, and S3 are repeatedly applied until the serial register in filled.

FIG. 10C2 illustrates how the serial-parallel registers and the parallel registers are clocked during the serial-to-parallel transfer portion of the data acquisition cycle and during the parallel read-out transfers using the serial (S) and parallel clocks shown in FIG. 13.

a) Serial-to-parallel transfer takes place with clock phase P1* maintained in a low voltage state. This forms a channel stop under the gate 201. Then, when all of the stages of the serial register are full, the charge signals are stored under gates 205(1), 205(2), 205(3)... with clock phase S2 high. As shown in FIG. 13, one pulse of clock phase S3 is skipped and instead the P3 clock is applied to the gate 202. This results in moving the charge signals (shown by Qn(1) and Qn(2) in FIG 10C2) from the gates 205 in the serial register down under respective settings of the gate 202 of the parallel register.

At the same time, the P3 clock causes the charge signal Qn-1(1) and Qn-1(2) already in the parallel register and originally stored under the gate 208(1) to advance and be transferred under gate 209(1).

Clock pulses P1,P2, and P3 eventually cause the charge signals Qn(1) and Qn(2) to advance, in parallel, and be stored under the 208(1) gates and the charge signals Qn-1(1) and Qn-1(2) to be moved under the gate 208(2).

b) The serial-to-parallel charge transfers described in (a), above, are repeated until all of the sub-rows of the parallel register contain charge signals and charge signals are stored under the gates 208 M of the last sub-row of the parallel register of each macropixel.

Finally, when the parallel sub-rows of the macropixel are filled and the serial register sub-row is also filled with charge signal, the macropixel memory register is full. A read out cycle can now be initiated with clock phase S1 being maintained in a low voltage state to extend the vertical channel stops of the parallel registers (shown by hatched regions in 10C2) across the serial registers under the gates 206(1), 206(2), 206(3).

Thus, the serial and parallel registers of all macropixels are transformed into a single giant parallel register with vertical CCD channels. The frame read out cycle is then activated. The clock phase P1 is then applied to every third gate [207(m), 201, 207(1), 207(2)]. The clock phase P2 is applied to every third gate [208(m), gates 205 and 203, and gates 208(1), 208(2)]. The clock phase P3 is applied to every third gate [209(m), 202, 209(1), 209(2)]. The above clocking sequence results in parallel charge transfer of the single giant parallel register a row-at-a-time into a serial output register as discussed above and illustrated in FIGS. 1, 2, and 15.

Thus FIGS. 10C1 and 10C2 illustrate in a simplified manner how the structures of FIGS. 9, 10A and 10B may be used to effectuate serial transfer and then serial-to-parallel transfer, and then a parallel transfer in imagers of the type shown in FIGS. 3 and 4A.

A photo imager embodying the invention set forth in FIGS. 3, 4A, 9 and 10, may be formed using the four-level- polysilicon 3-phase CCD technology shown in FIG. 6F. Using presently available technology, the imager may include an array of 244 rows by 244 columns of macropixels with each macropixel comprising up to 475 storage elements or storage sites (pixels). That is, each storage register Gij could have up to 475 storage stages using one micron design rules.

The number (N) of storage elements (pixels) per storage register (Gij) is a function of the available technology and could be significantly greater than 475 if design rules smaller than 1.0 micron are employed.

Figure 10B:
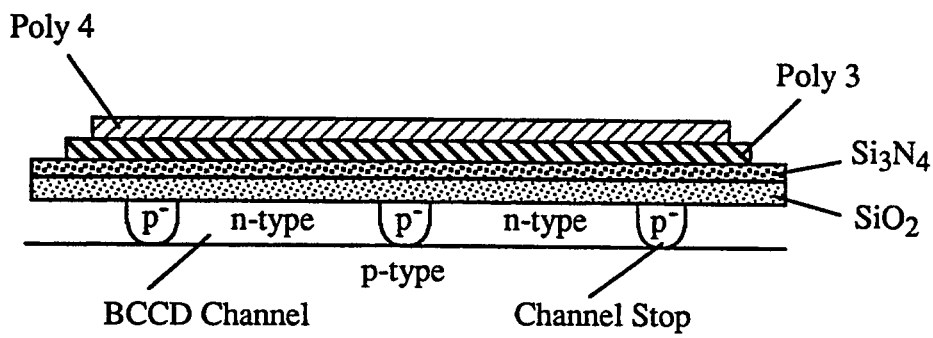
Figure 10B:
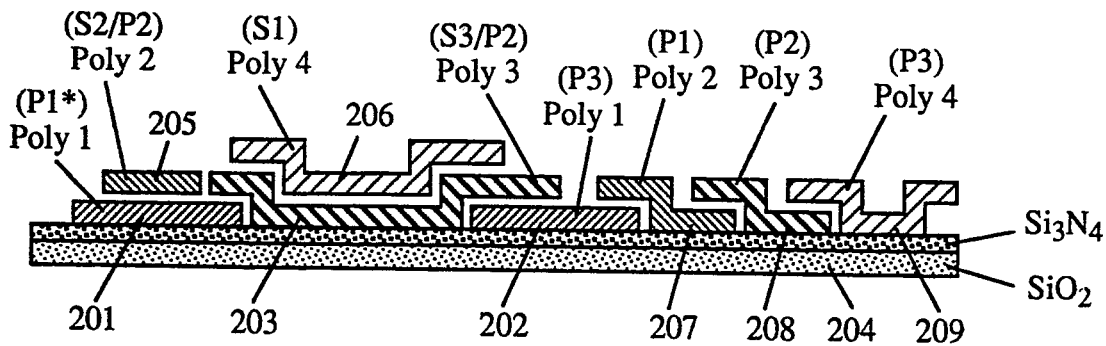
Figure 11:
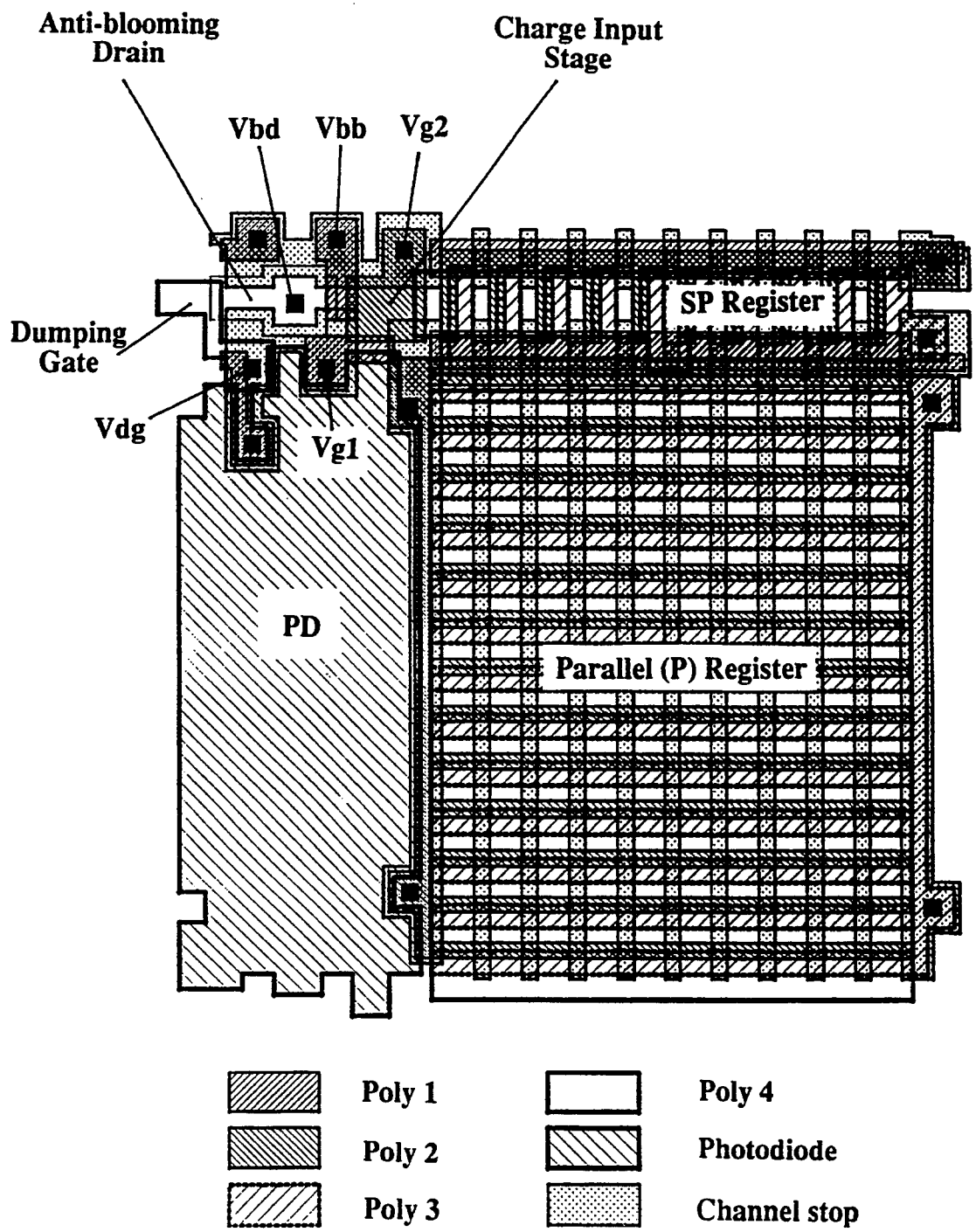
FIG. 11 is a top view of a macropixel embodying the invention useable in forming imagers having an architecture of the type shown in FIGS. 3 and 4A and constructed with CCD gate structure technology of the type shown in FIG. 9.

Referring to FIG. 11 there is shown the layout of a macropixel fabricated with 1.5 micron design rules to implement an imager architecture of the type shown in FIGS. 3 and 4A. The macropixel whose dimensions are 70.5 micron×70.5 micron is formed using 3-phase CCD and 4 polysilicon levels as shown in FIGS. 9 and 10. The macropixel includes:

1. a photodiode (PD) that occupies approximately 25% of the macropixel area;
2. an input stage to transfer charge from the photodiode to the SP register as detailed in FIGS. 5B, 5C, and 14A;
3. a serial-parallel (SP) register which (as detailed in FIGS. 10C1 and 10C2 above) can transfer charge signal serially and from serial-to-parallel during the data acquisition phase, and be one of the parallel registers during read-out; and
4. a parallel (P) register section.

The macropixel includes 14 sub-rows, the first sub-row being the serial register or serial-parallel (SP) register which includes 10 storage elements which are serially interconnected but which can be read out in parallel and the other 13 sub-rows of the macropixel being a parallel storage register (P). The parallel register section includes 10 sub-columns of parallel CCD registers with 13 CCD stages (or rows) formed along each column. Thus the contents of the serial register stored in the 10 serially connected CCD stages forming the serial register can subsequently be transferred from the serial register, in parallel, from row to row, along the 10 columns of the parallel registers. Therefore, when photo signals have been transferred to all the storage elements of the macropixel, there are 140 charge signals (pixels) stored in the register, assuming that the serial register also stores ten charge signals, with each charge signal representing a pixel of a frame.

Figure 12:
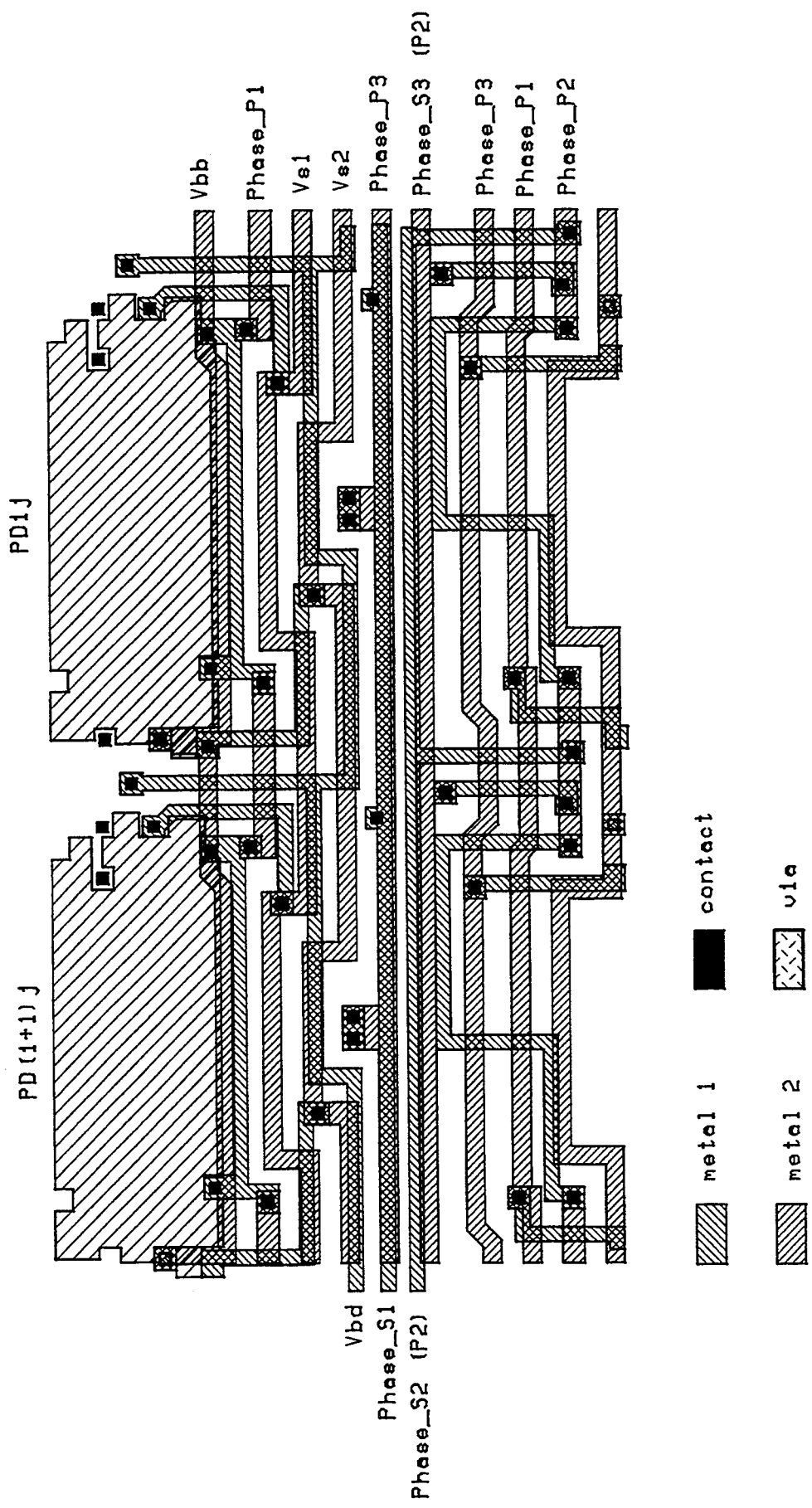
FIG. 12 is a top view of the layout of two level aluminum interconnects for the macropixel of FIG. 11.

Referring to FIG. 12, there is shown the layout of two layers of aluminum used to make all of the required electrical connections to the macropixel of FIG. 11. A third-layer of aluminum or some other opaque material (not shown), may be used to shield the CCD storage area from the optical signal. The mask for this optical shield would be essentially a complement of the active photodiode area. For this design, the fill factor (i.e. the ratio of the active photodiode area to the area of the macropixel) is approximately 25%.

In the macropixel design of FIG. 9 and 11 when 1.5 micron design rules are used, each stage of the parallel CCD register (pixel) has an area of 4.5 micron×4.5 micron with 1.5-micron channel stops and a 3-micron×1.5 micron charge storage area. Assuming a charge handling capacity of 5,000 electrons/square micron, the saturation charge signal, Qmax, is estimated to be 22,500 electrons/pixel. For a read-out noise of 25 electrons/pixel for an output register clock of about 100 kHZ, the dynamic range is 900 or 59 dB. Assuming the imager to be 244×244 macropixels and its contents to be read out by use of a simple and single output amplifier, the charge readout of this imager will involve up to 244×14=3,416 CCD stages in a vertical direction and up to 244×(10+3)=3,172 CCD stages in a horizontal direction. The resulting maximum number of 6,588 CCD transfer stages is comparable to the largest state-of-the-art CCD imagers. The number of charge transfers, however, could be reduced by 4 or 8 times by means of 2:1 multiplexing of the parallel register and 2:1 or 4:1 multiplexing of the serial output register.

As discussed above, the imager could be fabricated with 475 pixels per macropixel using one micron design rules. In such an imager, each macropixel could be made with an area of 80-micron ×80-micron, with the photodiode having an area of 20-micron×73-micron for a fill factor of about 23%. In this case, the pixels will be made to have a 3.0-micron×3.0-micron size with 1.0-micron channel stops and charge storage area of 2.0 square microns. Again, assuming a charge handling capacity of 5,000 electrons/square micron, the saturation signal of this imager will be 10,000 electrons/pixel. And for a read-out noise of 25 electron/pixel, the dynamic range of this imager will be 400 or 52 dB.

Referring back to FIG. 9, 10C1 and 10C2, an important design feature of the serial register of this macropixel design is that the vertical parallel transfer through the serial register is accomplished with an essentially constant 3-micron-wide CCD channel formed by gates 205 and 203 clocked by clock phases S2 and S3 of the serial register (see FIG. 9). In the structure of FIG. 9 the vertical (parallel) charge transfer is obtained by pulsing gates 205 and 203 with the parallel phase P2 clock, while the serial clock phase S1 is held in the low state to form channel stops under gate 206 during parallel transfers. While poly-1 gate 201 above the serial register and poly-1 gate 202 below the serial register form channel stops during the serial charge transfer, they become an integral part of the parallel (vertical) charge transfer operation during parallel transfer. In this mode, the upper poly-1 gate 201 is clocked by the phase P1 and the lower poly-1 gate is clocked by the phase P3.

Waveforms of the serial clocks (S1, S2, and S3) for the operation of the serial register and waveforms of the parallel clocks (P1*, P1, P2, and P3) for operation of the parallel (P) registers of FIGS. 9 and 11 are shown in FIG. 13. FIG. 13 shows 10 cycles of the serial register clocks which result in transferring 10 charge samples from the input stage of the macropixel along the serial register. Each of these charge samples represents one pixel of a frame. For each ten (10) cycles of the serial register clocks, there is one (1) cycle of the parallel register clocks.

Application of the clocking signals shown in FIG. 13 to the structure of FIG. 11 as detailed in FIGS. 9 and 10 produces the following operation of the macropixel. During an image acquisition cycle, the flow of charge signals from the photodiode to the serial and parallel registers is as follows. At a time t1, a first charge sample Q1 is transferred from the storage well under the g2 gate of the input stage (see FIG. 14B1) to the CCD well under the first gate of the first stage of the serial register clocked by the serial clock phase S1. At time t2 the charge sample Q1 is transferred under a second gate of the first stage of the serial register clocked by the second clock phase S2, and at time t3, the charge sample Q1 is transferred under the third gate clocked by phase S3.

This process is repeated as the charge sample Q1 is transferred through successive stages of the serial register. After the first clock cycle of the serial clock and with the beginning of the second clock cycle, charge sample Q2 is transferred into the first stage, while Q1 is transferred to the second stage. On each succeeding cycle, the charge signals advance by one stage along the serial register, while a new charge signal is transferred into the first stage. Finally, at the time t4 the charge sample Q1 enters the 10th stage of the serial register and a charge sample Q10 enters the first stage of the serial register. Then, at the time t5, when the phase S2 of the serial clock goes high, the charge samples Q1, Q2, ..., Q10 fill up the serial register. Then, when at the time t6 the phase P3 of the parallel clock goes high, the ten charge samples (Q1, Q2, ..., Q10) start to transfer from the serial register into the first stage (subrow) of the parallel register (P) under the phase P3 gate 202, as detailed in FIGS. 9 and 10. As discussed above, when charge samples are being loaded into the serial register the poly 1 clock phase P3 gate (as shown in FIGS. 9 and 10) formed, and acted as, a channel stop for the lower side of the serial register. Concurrently, the upper poly-1 gate 201 clocked with phase PI* is maintained in a low (off) state during the acquisition of the charge samples by the serial and parallel registers of the macropixel to form a channel stop for the upper side of the serial register. As indicated in FIGS 9 and 10, gate, 201 which is clocked by a phase P1* of the parallel clock, is turned-on only during the charge read-out cycle from the parallel registers of the macropixels. At all other time gate 201 is held in the low voltage (off) state via P1* to act as a channel stop.

Note that as the charge samples Q1, Q2, ..., Q10 are transferred from the serial register to the first subrow of the parallel register, the ten charge samples originally stored under the first (top) subrow of the parallel (P) register are transferred to the second (second) subrow of the P register. In other words, all of the charge signals stored in the P register move from one sub-row to the following sub-row along the column.

Examination of FIG. 13 shows that the serial clocks S1 and S2 are continuous with equal periods. This assures that the successive charge samples have constant optical integration time.

Referring to FIG. 13, it should also be noted that in order to assure proper serial-to-parallel transfer, the parallel clock phases P3 at t6 and P1 at t7 are preferably slightly advanced in relation to the serial clock phase S1 at t*. In other words, the beginning of the P1 pulse at t7 should precede the beginning of the S1 pulse at t* and the falling edge of the P3 pulse should start before the beginning of the S1 pulse at t*.

It should also be noted that during the serial charge transfers associated with loading of the serial register, the previously detected charge samples are stored in the wells of the parallel P register under respective gate(s) 208 (see FIGS. 9 and 10) to which is applied the clock phase P2.

The input structure of a photodiode and its associated storage register, where the register is of the type into which information is serially loaded and from which information can be read out in parallel, is illustrated in FIG. 14A. In one mode of operation, the charge signal can be read out from the photodiode by a continuous charge skimming mode also, known in the art of IR imagings as the direct injection read-out. This is shown in FIGS. 14B1 and 14B2. For operation in the continuous charge skimming mode, the photodiode is biased one MOSFET threshold voltage (VT) below the dc voltage Vg1. FIG. 14B2 is intended to illustrate that the signal charge collected under gate g2 controlled by a dc voltage Vg2, is periodically removed by the serial register clock phase 01.

Charge signals may also be read out from the photodiode by a voltage reset mode illustrated in FIGS. 14C1 and 14C2. In this case, the photodiode is periodically reset to the channel potential under the g1 gate by application of a positive voltage pulse Vg1 to gate g1. The pulsing of the g1 gate results in a periodic removal of the detected charge signal from the photodiode.

FIGS. 14D1 and 14D2 illustrate charge dumping and electronic shutter operations. Referring to FIG. 14D1, note that photosignals may be transferred from the photodiode to an area under gate g1 and then from under gate g1 to an area under gate g2 and then from under gate g2 to an area under gate gbb and into the blooming control drain bd. The transfers are effectuated by applying voltages Vg1, Vg2 and Vbb to gates g1, g2 and gbb respectively and voltage Vbd to the drain bd. The structure shown in FIGS. 14A and 14D1 enables the control of blooming in the presence of a large optical overload by means of a constant voltage Vbb applied to gate gbb and the application of Vbd to blooming drain bd. In this case the excess charge signal which can not be contained by the CCD register spills over the barrier under gate gbb shown in FIG. 14D1 and into the blooming drain (bd) as shown in FIG. 14D2.

FIG. 14D2 also illustrates the electronic exposure control by the potential profile shown as a dotted line. This can be used in conjunction with the continuous charge skimming shown in FIG. 14B2. Electronic shuttering may be accomplished by steering, the photogenerated charge signal directly into the blooming drain bd. This may be done by lowering the blooming barrier potential Vbb below the channel potential in the potential well under the g2 gate. The electronic exposure control allows the imager to operate with an effective optical integration time that can be shorter than the micro-frame-time. The minimum optical integration time is estimated to be less than 0.25 microsecond while micro-frame time of each pixel is determined by the period of the serial register clock that is assumed to be 1.0 microsecond or longer. (While f1 may be 1 MHz giving a sample time of 1 microsecond only ¼ of this time is needed to perform various housekeeping functions.)

The blooming drain shown in FIGS. 14A and 14D1 may be used for dumping charge present at the end of a serial register of an adjacent macropixel. This is shown in FIG. 14E which is a conceptual representation of a gating arrangement. By application of a positive voltage level, Vdg, to the dump gate (dg), the blooming drain (bd) of macropixel (j+1) becomes a "dump" drain for the serial register of a macropixel in column (j) of the same row. This allows continuous clocking of the serial register in macropixel j by the serial clock phases (S1, S2, and S3) in anticipation of a transient event to be recorded by the high frame rate imager. The maximum lead time for capturing a transient imaging event is equal to the number of periods of the serial clock corresponding to the number of stages of the serial register. Once a signal is received by the imager system indicating that a transient imaging event took place, Vdg voltage is switched to a low value forming a channel stop and blocking a path to the drain bd. The acquisition of the first row of image frames can then be initiated by a parallel transfer of the contents of the serial register to the second subrow of the parallel register as in FIGS. 4A, 9, 10, and 11 or to a next row as in FIG. 2. The selectively enabled "dump drain" operation provides for the maximum lead time for recording a transient imaging event.

As discussed above, during read-out of the contents of the imager, the input stages of the macropixels may be deactivated by turning-on the blooming control gate.

During read-out operation, the input potential well under the gate g2 is isolated from the serial-parallel register by a potential barrier formed under the gate 206(1) of macropixel (j+1). A low voltage state is applied to gate 206(1) by means of clock pulse S1 as shown in FIG. 14B1. Concurrently a positive signal Vbb applied to blooming gate bb prevents any charge signal detected by the photodiode from accumulating in the input well under the g2 gate.

Referring to FIG. 15, there is shown a section of the serial output (O) register associated with a column of macropixels. The serial output register is a 3-phase CCD register with a length of 12 stages. 10 of the 12 stages of the serial output registers correspond to the 10 horizontal stages (pixels) of the macropixel and the extra two (2) stages cover the space under the (17 micro-wide) photodiode.

Read out of selected frames is initiated by the clock phases P1, P2, P3 as well as P1* (being the same as P1) applied to the parallel registers of all macropixels. The resulting operation transfers one row of charge signals at a time into the output serial register. This in turn is followed by a serial read out of the whole row of charge signals by a 3-phase CCD clock powering the output register. This process is repeated until the completion of the read out. Assuming a fast framing rate imager with 244×244 macropixels with each macropixel capable of storing 10×14 charge samples, the readout of each row will take 244×(10+2) cycles of the output serial register and the imager frame will have 244×244 pixels and the imager will be able to acquire 140 frames during the image acquisition periods. The reconstruction of the signal from the serial output register may be accomplished by means of an external memory.

Referring to FIG. 15 transistors T1, T2, and T3 enable a voltage output of the serial output register to be detected by a two-stage floating diffusion amplifier. Transistors T1 and T3 may be designed with a lightly doped drain to reduce the readout noise to about 10 to 25 rms electrons/pixel for the output register readout clock frequency at 200 KHz.

In FIG. 15, as shown in FIG. 11, two levels of aluminum may be used for all of the electrical connections for the proposed image sensor. A third layer of aluminum, or some other opaque material, will be used for the optical shield of the CCD storage areas of the macropixels and for the CCD serial output register. No electrical connections need be made to the optical shield.

In FIGS. 1 and 2, the output serial register is shown located at the bottom of each column. It should be appreciated that the output serial register could be located at the top or in the middle of the array. It should further be appreciated that the array may by partitioned and that there may be more than one serial output register serving the imager array.

It has been shown that the photo information is transferred from all the photosensors at the same time and during the same clock cycle to the respective inputs of their associated serial registers. This enables a very high frame rate to be achieved with systems embodying the invention. The very high frame rate of operation can be maintained until all the stages of the storage registers Gij are loaded. At which point the sensing of new information is blocked by the electronic shutter action until the contents of the serial register are read out.

The high frame rate image sensor consists of a novel charge coupled device (CCD) image sensor structure in which each CCD pixel consists of a photosensitive area adjacent to a plurality of CCD type analog memory cells. The memory cells associated with a given photosensor site are loaded sequentially from a photo site at the high frame rate and then unloaded at a slower read out rate after the high speed framing sequence is over.

What is claimed is:
1. An image sensor comprising:
    an array of M photo sensitive elements arranged in "R" rows and "C" columns; where R and C are integers greater than one; and R times C is equal to M;
    M storage registers, one register per photo sensitive element; each one of said M storage registers being coupled to a respective one of said M photo sensitive elements; each one of said M storage registers including N storage elements; where N is an integer greater than two;
    means coupled to each one of said M storage registers for selectively sampling photo signals generated by its associated photo sensitive element and transferring the sampled photo signals to, and propagating them along, the N storage elements of its associated storage register, at a first rate, for storing sampled photo signals in the storage elements of its associated M storage register; and
    means coupled to the M storage registers for selectively reading-out the photo signals stored in the storage elements of each storage register, at a second rate.

2. An image sensor as claimed in claim 1 wherein each one of said M storage registers is physically located adjacent to its associated photo sensitive element for forming a local memory.

3. An image sensor as claimed in claim 1 wherein said first rate is substantially faster than said second rate.

4. An image sensor as claimed in claim 1 wherein each one of said N storage elements is a charge coupled device (CCD) shift register stage.

5. An image sensor as claimed in claim 1 wherein said means coupled to the M storage registers for selectively reading-out the stored photo signals includes: (a) one row sense line per row of said M photo sensitive elements and their associated storage registers; and (b) switching means coupled between each storage register along a row and its associated row sense line for selectively reading-out the contents of each storage register onto its associated row-sense-line.

6. An image sensor as claimed in claim 5 wherein the switching means coupled between each storage register and its associated row sense line includes two transistors, one transistor being responsive to a row select signal and the other transistor being responsive to a column select signal.

7. An image sensor as claimed in claim 6 wherein each one of said two transistors is a metal-oxide-semiconductor field-effect transistor (MOSFET).

8. An image sensor as claimed in claim 1 wherein the M storage registers are arranged in R rows and C columns, each one of said M storage registers being formed in close proximity to its associated photosensitive element, wherein said means coupled to the M storage registers for selectively reading-out the stored photo signals includes: a) means interconnecting the storage registers along each column for transferring, in parallel, the contents of each storage register of a row to the storage register of the next row along the column; and b) means coupling the storage register in the last row of each column, in parallel, to an output serial register.

9. An image sensor as claimed in claim 8 wherein photo signals are transferred in parallel, along each column from the storage register in one row to a storage register in a subsequent row at said second rate and wherein means coupled to the output serial register function to propagate the photo signals along the output serial register at a third rate.

10. An image sensor as claimed in claim 1 wherein the N storage elements of each one of said M register are arranged in X subrows and N/X subcolumns, with each subrow including N/X storage elements; where X is an integer equal to or greater than one and less than N.

11. An image sensor as claimed in claim 10 wherein each photo sensitive element associated with a storage register is coupled to a first subrow of the X subrows of the storage register, wherein the N/X storage elements of the first subrow are interconnected for serially transferring and propagating photo signals from the associated photo sensitive element to the N/X storage elements along the first subrow; and means interconnecting the X subrows of each storage register for enabling the contents of each subrow of a register to be transferred, in parallel, to the next subrow of the register during a data acquisition phase.

12. An image sensor as claimed in claim 11 wherein the means coupled to the M storage registers for selectively reading out the photo signals includes means coupled to the N/X storage elements in said N/X subcolumns along each column for transferring the information contained in each one of said N/X storage elements of said N/X subcolumns, in parallel, to a corresponding N/X storage element in a succeeding subrow.

13. An image sensor as claimed in claim 1 wherein each one of said M registers includes charge coupled device (CCD) structures with conductive electrodes; and wherein said means coupled to each one of said M storage registers for selectively sampling photo signals and transferring the sampled photo signals and said means coupled to the M storage registers for selectively reading-out the photo signals include a first set of conductive electrodes disposed to move charge signals generally in a first direction and a second set of conductive electrodes disposed to move charge in a second direction, which is generally perpendicular to said first direction;

wherein at least one of the conductive electrodes in said second set functions to produce channel stops along said first direction while signals are applied to said first set of conductive electrodes to cause them to transfer charge signals along said first direction; and wherein at least one of the conductive electrodes in said first set functions to produce channel stops along said second direction while signals are applied to said first and second set of conductive electrodes for transferring charge signals along said second direction.

14. An image sensor as claimed in claim 13 wherein said first and second set of are formed using four different levels of polysilicon and wherein the control voltages applied to said conductive electrodes include a multi-phase type of clocking system.

15. An image sensor as claimed in claim 1 wherein said photo sensitive elements are photodiodes.

16. An image sensor as claimed in claim 1 wherein each one of said M registers is formed using charge coupled devices (CCD's) and wherein each one of said registers includes a charged coupled device means coupled to each register for providing blooming control and electronic shutter operation.

17. An image sensor as claimed in claim 1 wherein each one of said M registers includes charge coupled device (CCD) structures and wherein each one of said M registers includes a means coupled to each register for selectively providing a charge dumping mechanism.

18. An image sensor as claimed in claim 1 wherein each one of said M registers includes charge coupled device (CCD) structures employing a virtual single-phase technology.

19. An image sensor as claimed in claim 1 wherein each one of said M registers includes charge coupled device (CCD) structures employing a coplanar two-phase technology.

20. An image sensor as claimed in claim 1 wherein each one of said M registers includes charge coupled device (CCD) structures employing two levels of polysilicon and two-phase clock signals.

21. An image sensor as claimed in claim 1 wherein each one of said M registers includes charge coupled device (CCD) structures employing two levels of polysilicon and four-phase clock signals.

22. An image sensor as claimed in claim 1 wherein each one of said M registers includes charge coupled device (CCD) structures employing three levels of polysilicon and three-phase clock signals.

23. The image sensor of claim 1 wherein said means coupled to the M storage registers for selectively reading out the photo signals includes an output serial shift register, and means coupled to the M shift registers and to the output serial shift register for during a read-out cycle coupling and transferring information from the M storage registers, in parallel, into the output serial shift register and for serially propagating the information transferred into the output serial shift register to an output means.

24. The image sensor as claimed in claim 23, wherein photo signals are serially propagated along said M storage registers during data acquisition and wherein photo signals are propagated in parallel along said M storage registers and into said serial output registers during the read-out of the photo signals.

25. The combination comprising:
an array of M photosensors arranged in "R" rows and "C" columns; where R and C are integers greater than one and R times C is equal to M;
M storage registers; each storage register having N storage elements; one storage register and its associated N storage elements being associated with each one of said M photosensors; where N is an integer greater than two; each one of said M photosensors being coupled to its associated N storage elements for selectively enabling the transfer of photo information from the photosensor to its associated N storage elements and for storing photo information in the associated N storage elements; and
means coupled to the N storage elements of all the rows in a column for selectively transferring the information in parallel from one row to a succeeding row along the column.

26. The combination as claimed in claim 25, wherein each one of said N storage elements is formed using charge coupled devices (CCDs).

27. The combination as claimed in claim 25, further including a serial output register having C sections connected in series, each one of said C sections corresponding to a column, and each section including a sufficient number of stages coupled to the elements of its associated column for receiving information in parallel from the elements of its associated column; and wherein the means coupled to the N storage elements of all the rows in a column control the transfer of information, in parallel, from row to row to the serial output register.

28. The combination as claimed in claim 27 wherein a first clocking signal (f1) is applied to the N storage elements for propagating signals along each serial register at a rate of f1; and wherein a second clocking signal (f2) is applied to the storage elements of each row and to the serial output register for transferring signals, in parallel, along each column from the storage elements of one row to the storage elements of a succeeding row along the columns and to the serial output register at a rate of f2; where f1 is a higher frequency than f2.

29. A method of operating an image sensor comprising an array of M photo sensitive elements arranged in "R" rows and "C" columns; and in which there is further included N storage registers, one register per photo sensitive element; each one of said M storage registers being coupled to a respective one of said M photo sensitive elements; each one of said M storage registers including N storage elements comprised of charge coupled devices CCD's; where R and C are integers greater than one; and R times C is equal to M; and N is an integer greater than two; and further including means coupled to each one of said M storage registers for, during an image acquisition period, selectively sampling photo signals generated by its associated photo sensitive element and transferring the sampled photo signals to, and along, the N storage elements of its associated storage register for storing the photo signals; and further including means coupled to the M storage registers for selectively reading-out the photo signals stored in each storage register;

a method comprising the steps of operating the image sensor at a first rate during an image acquisition period; and operating the image sensor at a second, different, rate during a read-out period.

30. A method of operating an image sensor comprising an array of M photo sensitive elements arranged in "R" rows and "C" columns; and in which there is further included M storage registers, one register per photo sensitive element; each one of said M storage registers being coupled to a respective one of said M photo sensitive elements; each one of said M storage registers including N storage elements comprised of charge coupled devices CCD's; where R and C are integers greater than one; and R times C is equal to M; and N is an integer greater than two; and further including means coupled to each one of said M storage registers for, during an image acquisition period, sampling photo signals generated by its associated photo sensitive element and transferring and propagating the sampled photo signals to the N storage elements of its associated storage register storing the photo signals; and means coupled to the M storage registers for reading-out the photo signals stored in each storage register;

comprising the steps of operating the image sensor so as to continuously sample and store photo information, including a step of stopping the acquisition of new photo information from the registers and the step of reading-out the information accumulated in the registers for a given time prior to the occurence of a particular event of interest.

31. An image sensor comprising:

an array of M photo sensitive elements arranged in "R" rows and "C" columns; where R and C are integers greater than one; and R times C is equal to M;

M storage registers, one register per photo sensitive element; each one of said M storage registers being coupled to a respective one of said M photo sensitive elements; each one of said M storage registers including N storage elements comprised of charge coupled devices (CCD's); where N is an integer greater than two;

means coupled to each one of said M storage registers for, during a photo information acquisition period, selectively sampling photo signals generated by its associated photo sensitive element and transferring the sampled photo signals to, and along, the N storage elements of its associated storage register at a first rate;

means coupled to the M storage registers for, during a photo information read-out period, selectively reading-out the photo signals stored in each storage register at a second rate; and blooming control means coupled to each one of said M storage registers for limiting the maximum charge signal level that can be coupled from a photosensitive element to its corresponding storage register.

32. An image sensor comprising:

an array of M photo sensitive elements arranged in "R" rows and "C" columns; where R and C are integers greater than one; and R times C is equal to M;

M storage registers, one register per photo sensitive element; each one of said M storage registers being coupled to a respective one of said M photo sensitive elements; each one of said M storage registers including N storage elements comprised of charge coupled devices (CCD's); where N is an integer greater than two;

means coupled to each one of said M storage registers for, during a photo signal acquisition period, selectively sampling photo signals generated by its associated photo sensitive element and transferring the sampled photo signals to, and along, the N storage elements of its associated storage register at a first rate; means coupled to the M storage registers for, during a photo signal read-out period, selectively reading-out the photo signals stored in each storage register at a second rate; and selectively enabled charge dumping control means coupled to a particular point along each one of said M storage registers for selectively dumping charge signals at said particular point.

* * * * *